(12) United States Patent
Liu et al.

(10) Patent No.: US 12,727,358 B2
(45) Date of Patent: Sep. 1, 2026

(54) DISPLAY PANEL, DRIVING METHOD FOR DISPLAY PANEL, AND DISPLAY DEVICE

(71) Applicants: Wuhan Tianma Micro-Electronics Co., Ltd., Wuhan (CN); Wuhan Tianma Micro-Electronics Co., Ltd. Shanghai Branch, Shanghai (CN)

(72) Inventors: Shengjuan Liu, Wuhan (CN); Chong Qian, Wuhan (CN); Shaowei Liu, Wuhan (CN); Dan Dong, Wuhan (CN)

(73) Assignees: Wuhan Tianma Micro-Electronics Co., Ltd., Wuhan (CN); Wuhan Tianma Micro-Electronics Co., Ltd. Shanghai Branch, Shanghai (CN)

( * ) Notice: Subject to any disclaimer, the term of this patent is extended or adjusted under 35 U.S.C. 154(b) by 343 days.

(21) Appl. No.: 18/631,498

(22) Filed: Apr. 10, 2024

(65) Prior Publication Data

US 2025/0228096 A1 Jul. 10, 2025

(30) Foreign Application Priority Data

Jan. 8, 2024 (CN) ......................... 202410029418.9

(51) Int. Cl.

| | |
|---|---|
| ***H10K 59/35*** | (2023.01) |
| ***G09G 3/20*** | (2006.01) |
| ***G09G 3/3225*** | (2016.01) |
| ***H10K 59/121*** | (2023.01) |
| ***H10K 59/131*** | (2023.01) |

(52) U.S. Cl.

CPC ......... *H10K 59/353* (2023.02); *H10K 59/131* (2023.02); *H10K 59/351* (2023.02); *H10K 59/352* (2023.02)

(58) Field of Classification Search

CPC .. H10K 59/131; H10K 59/351; H10K 59/352; H10K 59/121; H10K 59/353; G09G 3/3225; G09G 3/2074

See application file for complete search history.

(56) References Cited

U.S. PATENT DOCUMENTS

| | | | | |
|---|---|---|---|---|
| 11,424,297 B2 * | 8/2022 | Jian | ...................... | H10K 59/131 |
| 11,527,206 B2 * | 12/2022 | Kim | ...................... | G09G 3/3233 |
| 2017/0039918 A1 * | 2/2017 | Tsao | ...................... | G09G 3/2003 |

(Continued)

FOREIGN PATENT DOCUMENTS

| | | |
|---|---|---|
| CN | 113130535 A | 7/2021 |

*Primary Examiner* — Mohsen Ahmadi

(74) *Attorney, Agent, or Firm* — Anova Law Group, PLLC

(57) ABSTRACT

Display panel, driving method for display panel, and display device are provided. The display panel includes first display area and second display area. Light transmittance of the first display area is greater than light transmittance of the second display area. The first display area and the second display area include first pixel rows and second pixel rows. The first pixel row includes first sub-pixel and second sub-pixel arranged along a first direction. The second pixel row includes third sub-pixels arranged along the first direction. The first pixel row and the second pixel row are arranged along a second direction. Along the second direction, spacing between the first pixel row and the second pixel row adjacent to the first pixel row in the first display area is greater than spacing between the first pixel row and the second pixel row adjacent to the first pixel row in the second display area.

20 Claims, 15 Drawing Sheets

(56) References Cited

U.S. PATENT DOCUMENTS

| | | | | |
|---|---|---|---|---|
| 2019/0140030 | A1* | 5/2019 | Huangfu | G09G 3/3233 |
| 2019/0319079 | A1* | 10/2019 | Xing | H10K 59/351 |
| 2020/0342797 | A1* | 10/2020 | Zhai | G02F 1/29 |
| 2022/0013598 | A1* | 1/2022 | Park | H10K 59/353 |
| 2022/0299819 | A1* | 9/2022 | Ishikawa | G02F 1/133514 |
| 2024/0088165 | A1* | 3/2024 | Shin | H10D 86/60 |
| 2024/0244889 | A1* | 7/2024 | Han | H10K 59/1201 |
| 2025/0089452 | A1* | 3/2025 | Ma | H10K 59/353 |

* cited by examiner

DISPLAY PANEL, DRIVING METHOD FOR DISPLAY PANEL, AND DISPLAY DEVICE

CROSS-REFERENCE TO RELATED APPLICATION

The present disclosure claims priority of Chinese Patent Application No. 202410029418.9, filed on Jan. 8, 2024, the entire content of which is hereby incorporated by reference.

FIELD OF THE DISCLOSURE

The present disclosure generally relates to the field of display screens and, more particularly, relates to a display panel, a driving method for a display panel, and a display device.

BACKGROUND

An organic light-emitting diode (OLED) display screen includes a large quantity of tiny OLEDs, and each OLED is a pixel. Accordingly, pixel arrangement may determine color and brightness of each pixel, affecting display effects of a display screen. Different approaches of pixel arrangement may affect clarity, color vividness and energy consumption of a display screen.

As such, a method is urgently needed to improve display effects of display panels.

SUMMARY

One aspect of the present disclosure includes a display panel. The display panel includes a first display area and a second display area at least partially surrounding the first display area. Light transmittance of the first display area is greater than light transmittance of the second display area. The first display area and the second display area each include a plurality of first pixel rows and a plurality of second pixel rows. A first pixel row of the plurality of first pixel rows includes a first sub-pixel and a second sub-pixel that are alternately arranged along a first direction, a second pixel row of the plurality of second pixel rows includes a plurality of third sub-pixels arranged along the first direction, the first pixel row and the second pixel row are alternately arranged along a second direction, the first direction and the second direction intersect, and the first sub-pixel, the second sub-pixel and a third sub-pixel of the plurality of third sub-pixels emit light of different colors. Along the second direction, a spacing between the first pixel row and the second pixel row adjacent to the first pixel row, in the first display area, is a first spacing, and a spacing between the first pixel row and the second pixel row adjacent to the first pixel row, in the second display area, is a second spacing. The second spacing is smaller than the first spacing.

Another aspect of the present disclosure includes a driving method for a display panel. The display panel includes a first display area and a second display area at least partially surrounding the first display area. Light transmittance of the first display area is greater than light transmittance of the second display area. The first display area and the second display area each include a plurality of first pixel rows and a plurality of second pixel rows. A first pixel row of the plurality of first pixel rows includes a first sub-pixel and a second sub-pixel that are alternately arranged along a first direction, a second pixel row of the plurality of second pixel rows includes a plurality of third sub-pixels arranged along the first direction, the first pixel row and the second pixel row are alternately arranged along a second direction, the first direction and the second direction intersect, and the first sub-pixel, the second sub-pixel and a third sub-pixel of the plurality of third sub-pixels emit light of different colors. Along the second direction, a spacing between the first pixel row and the second pixel row adjacent to the first pixel row, in the first display area, is a first spacing, and a spacing between the first pixel row and the second pixel row adjacent to the first pixel row, in the second display area, is a second spacing. The second spacing is smaller than the first spacing. The display panel also includes a junction area. The junction area includes a first sub-area and a second sub-area that are adjacent along the first direction, the first sub-area is located in the first display area, and the second sub-area is located in the second display area. The driving method includes determining whether a picture to be displayed is a specific picture. The specific picture is at least partially located in the junction area and includes a boundary to be displayed in the junction area, and the boundary to be displayed includes a first sub-boundary located in the first sub-area and a second sub-boundary located in the second sub-area. The driving method also includes determining whether to adjust the picture to be displayed based on a spacing between the first sub-boundary and the second sub-boundary in the second direction and brightness difference between the first sub-boundary and the second sub-boundary, and if so, driving at least one first pixel row of the first pixel rows and/or at least one second pixel row of the second pixel rows adjacent to the first sub-boundary in the first sub-area for display.

Another aspect of the present disclosure includes a display device. The display device includes a display panel. The display panel includes a first display area and a second display area at least partially surrounding the first display area. Light transmittance of the first display area is greater than light transmittance of the second display area. The first display area and the second display area each include a plurality of first pixel rows and a plurality of second pixel rows. A first pixel row of the plurality of first pixel rows includes a first sub-pixel and a second sub-pixel that are alternately arranged along a first direction, a second pixel row of the plurality of second pixel rows includes a plurality of third sub-pixels arranged along the first direction, the first pixel row and the second pixel row are alternately arranged along a second direction, the first direction and the second direction intersect, and the first sub-pixel, the second sub-pixel and a third sub-pixel of the plurality of third sub-pixels emit light of different colors. Along the second direction, a spacing between the first pixel row and the second pixel row adjacent to the first pixel row, in the first display area, is a first spacing, and a spacing between the first pixel row and the second pixel row adjacent to the first pixel row, in the second display area, is a second spacing. The second spacing is smaller than the first spacing.

Other aspects of the present disclosure may be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

Figure 1:
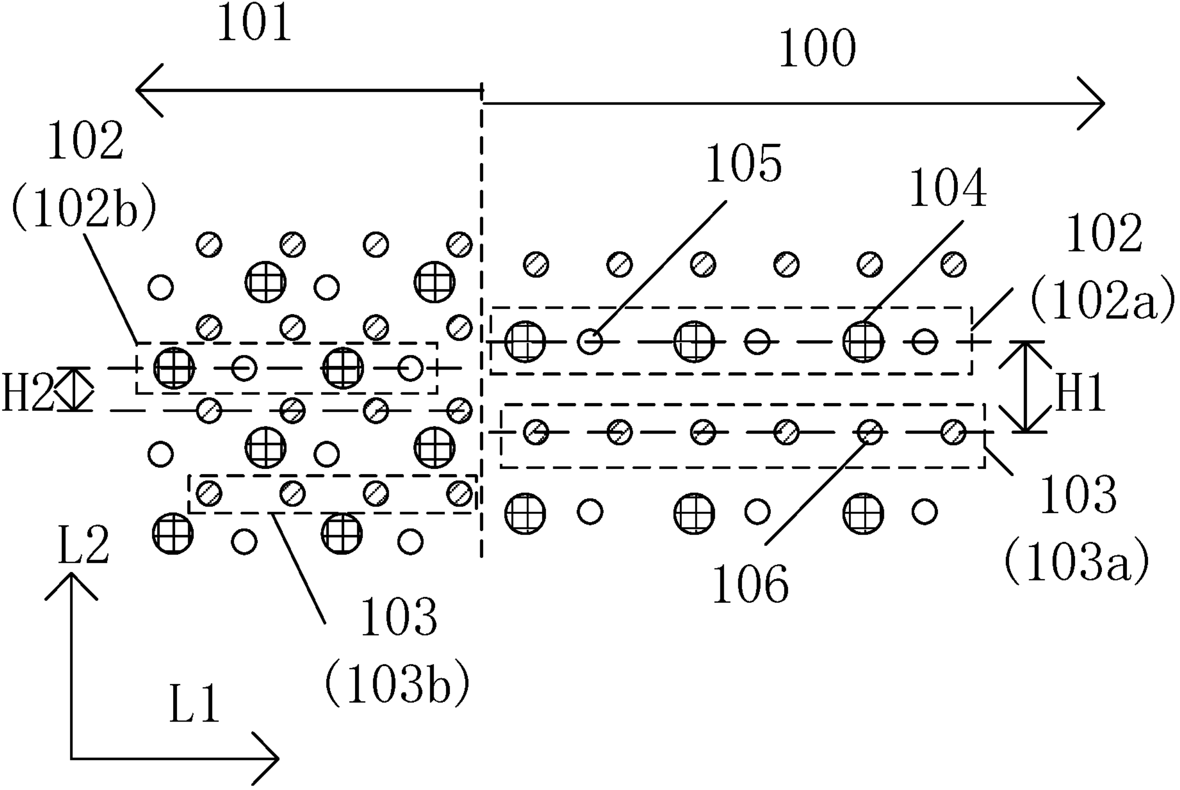
FIG. 1 illustrates a schematic structural diagram of a display panel consistent with the disclosed embodiments of the present disclosure.

The above drawings include the following reference numerals: 100, first display area; 101, second display area; 102, first pixel row; 1021, first sub-pixel row; 1022, second sub-pixel row; 103, second pixel row; 1031, third sub-pixel row; 1032, fourth sub-pixel row; 104, first sub-pixel; 105, second sub-pixel; 106, third sub-pixel; 107, first virtual trapezoid; 108, second virtual trapezoid; 109, first virtual parallelogram; 110, second virtual parallelogram; 111, third virtual trapezoid; 112, third virtual parallelogram; 113, fourth virtual parallelogram; 114, virtual quadrilateral; 115, junction area; 116, first sub-area; 117, second sub-area; 118, display panel; 120, scan line; and 121, data line.

DETAILED DESCRIPTION

To make the objectives, technical solutions and advantages of the present disclosure clearer and more explicit, the present disclosure is described in further detail with accompanying drawings and embodiments. It should be understood that the specific exemplary embodiments described herein are only for explaining the present disclosure and are not intended to limit the present disclosure.

Technologies, methods, and equipment known to those of ordinary skill in relevant fields may not be discussed in detail, but where appropriate, these technologies, methods, and equipment should be regarded as part of the present disclosure.

It should be noted that in the present disclosure, relational terms such as “first” and “second” are only used to distinguish one entity or operation from another entity or operation, and do not necessarily require or imply that such actual relationship or sequence exists between these entities or operations. Terms “comprise”, “include” or any other variations thereof are intended to cover a non-exclusive inclusion. A process, method, article, or apparatus that includes a series of elements includes not only the series of elements, but also other elements not expressly listed, or elements inherent to such a process, method, article, or apparatus. Without further limitation, an element defined by a statement like “comprises a . . . ” does not exclude the presence of additional identical elements in a process, method, article, or apparatus that includes the foregoing element.

Unless otherwise defined, technical and scientific terms used herein have same meanings commonly understood by those of ordinary skill in the art to which the present disclosure belongs. It should be noted that technical and scientific terms used herein are only for describing specific embodiments and are not intended to limit the present disclosure.

It should be understood that when an element (such as a layer, a film, a region, or a substrate) is referred to as being “over” another element, the element may be directly on the other element, or intervening elements may be present. In addition, in the present disclosure, when an element is described as being “connected” to another element, the element may be “directly connected” to the other element, or “connected” to the other element through a third element.

It should be understood that the term “and/or” used in the present disclosure only describes association relationships of related objects, indicating that three relationships may exist: For example, “A and/or B” may mean: A exists alone, A and B exist simultaneously, and B exists alone. In addition, the character “/” in the present disclosure generally indicates that the related objects may have an “or” relationship.

In the present disclosure, the display panel may be used in smartphones, tablet computers, smart home devices, smart cars, and smart wearable devices. An under-screen camera is a new type of camera technology that may be hidden under a mobile phone screen without affecting the overall aesthetics of the screen, and may automatically shoot through the screen when the camera needs to be used. However, in existing technology, different pixel arrangements may affect clarity, color vividness, and energy consumption of the display screen, resulting in poor display quality of the display panel.

Figure 2:
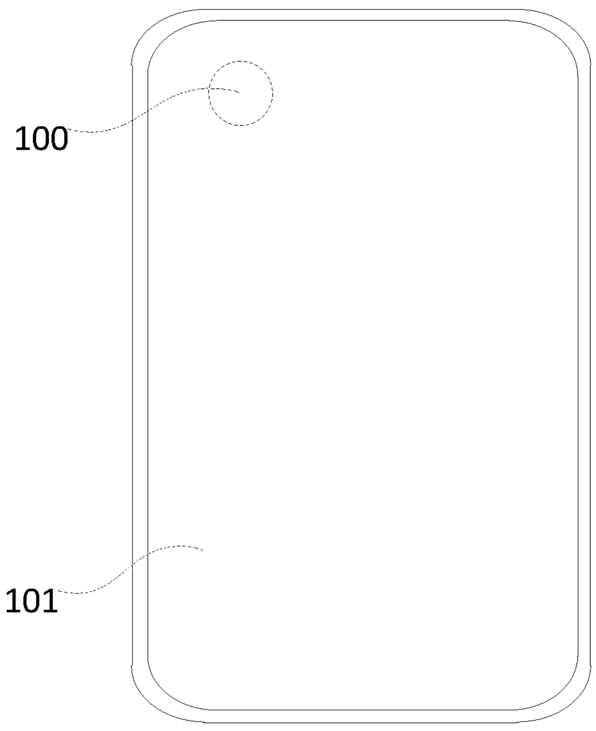
FIG. 2 illustrates a schematic structural diagram of another display panel consistent with the disclosed embodiments of the present disclosure.
Figure 3:
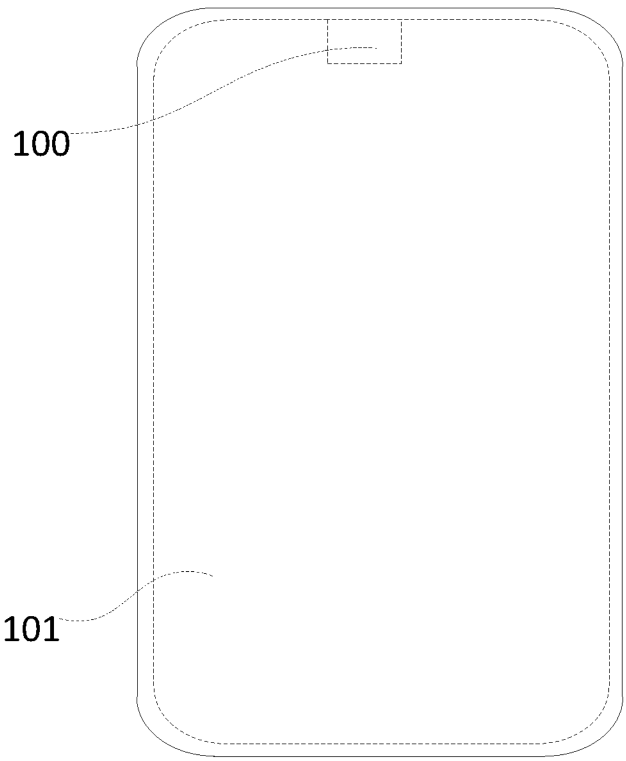
FIG. 3 illustrates a schematic structural diagram of another display panel consistent with the disclosed embodiments of the present disclosure.

To solve the above technical problems, the present disclosure provides a display panel. FIG. 1 illustrates a schematic structural diagram of a display panel consistent with the disclosed embodiments of the present disclosure. FIG. 2 illustrates a schematic structural diagram of another display panel consistent with the disclosed embodiments of the present disclosure. FIG. 3 illustrates a schematic structural diagram of another display panel consistent with the disclosed embodiments of the present disclosure. Referring to FIGS. 1-3, the display panel includes a first display area 100 and a second display area 101 at least partially surrounding the first display area 100. That is, the second display area 101 may be located above, below, left or right of the first display area 100, or may partially surround the first display area 100. In practical applications, the specific position of the second display area 101 may be set according to the layout and space requirements of the display panel. Specifically, as shown in FIG. 2, the second display area 101 may completely surround the first display area 100, or as shown in FIG. 3, the second display area 101 may partially surround the first display area 100. The light transmittance of the first display area 100 may be greater than the light transmittance of the second display area 101. In practical applications, the first display area 100 and the second display area 101 may be made of materials with different light transmittances, may be made with different manufacturing processes, or may have different designs, such that the light transmittance of the first display area 100 may be greater than the light transmittance of the second display area 101.

As shown in FIG. 1, the first display area 100 and the second display area 101 each include a plurality of first pixel rows 102 and a plurality of second pixel rows 103. Within a unit length along a second direction L2, a quantity of the first pixel rows 102 included in the first display area 100 (i.e., the first pixel rows 102*a*) and a quantity of the first pixel rows 102 included in the second display area 101 (i.e., the quantity of the first pixel row 102*b*) may be equal or may be different. Within the unit length along the second direction L2, a quantity of the second pixel rows 103 included in the first display area 100 (i.e., second pixel rows 103*a*) and a quantity of second pixel rows 103 included in the second display area 101 (i.e., the second pixel rows 103*b*) may be equal or may be different. The first pixel row 102 includes first sub-pixels 104 and second sub-pixels 105 alternately arranged along a first direction L1. The second pixel row 103 includes a plurality of third sub-pixels 106 arranged along the first direction L1. The first pixel rows 102 and the second pixel rows 103 are alternately arranged along the second direction L2. The first direction L1 and the second direction L2 intersect. That is, the first direction L1 and the second direction L2 may be perpendicular to each other, or may intersect but are not perpendicular. The first sub-pixel 104, the second sub-pixel 105 and the third sub-pixel 106 may emit light of different colors. For example, the first sub-pixels 104, the second sub-pixels 105 and the third sub-pixels 106 may be R pixels, G pixels and B pixels respectively, and emit light of different colors.

As shown in FIG. 1, along the second direction L2, a spacing between the adjacent first pixel row 102 and the second pixel row 103 in the first display area 100 is a first spacing H1, that is, a spacing in the second direction L2 between two adjacent pixel rows in the first display area 100. A spacing between the adjacent first pixel row 102 and the second pixel row 103 in the second display area 101 is a second spacing H2, that is, a spacing in the second direction L2 between two adjacent pixel rows in the second display area 101. The second spacing H2 is smaller than the first spacing H1. That is, the spacing between two adjacent pixel rows (first pixel row 102 and second pixel rows 103) in the second display area 101 is smaller, and the spacing between two adjacent pixel rows (first pixel rows 102 and second pixel rows 103) in the first display area 100 is larger. Accordingly, the problem of uneven display, such as an obvious dividing line between the first display area and the second display area (split screen phenomenon), may be alleviated, and the display effect of the first display area and the second display area of the display panel may be improved.

In the present disclosure, the first pixel row includes the first sub-pixels and the second sub-pixels alternately arranged along the first direction. The second pixel row includes a plurality of third sub-pixels arranged along the first direction. In addition, in the second direction, the first spacing between the adjacent first pixel row and the second pixel row in the first display area is greater than the second spacing between the adjacent first pixel row and the second pixel row in the second display area. Accordingly, the problem of uneven display, such as a dividing line between the first display area and the second display area (split screen phenomenon), may be alleviated, and the display effect of the first display area and the second display area of the display panel may be improved.

It should be noted that the spacing in the present disclosure is a minimum spacing. As shown in FIG. 1, the first spacing H1 is a minimum spacing between the adjacent first pixel row 102 and the second pixel row 103 in the first display area 100. Specifically, the first spacing H1 is the minimum spacing between the center of the sub-pixel in the first pixel row 102*a* and the center of the sub-pixel in the second pixel row 103*a*. It may be understood that in the first display area, the centers of the plurality of sub-pixels in the first pixel rows 102*a* may be located on a same straight line, and the centers of the plurality of sub-pixels in the second pixel row 103*a* may also be located on a same straight line. Similarly, the second spacing H2 is the minimum spacing between the adjacent first pixel row 102 and the second pixel row 103 in the second display area 101. Specifically, the second spacing H2 is the minimum spacing between the center of the sub-pixel in the first pixel row 102*b* and the center of the sub-pixel in the second pixel row 103*b*. It may be understood that in the first display area, the centers of the plurality of sub-pixels in the first pixel row 102*b* may or may not be located on a same straight line, and the centers of the plurality of sub-pixels in the second pixel row 103*b* may or may not be located on a same straight line.

To further improve the display effect of the display panel, in one embodiment, the display panel also includes a plurality of signal lines extending along the first direction. The signal lines may be at least one of data lines or scan lines. The data lines are configured to transmit image and video data, and the scan lines are configured to refresh the pixels on the display screen line by line. The scan line may refresh the pixels line by line in a certain order to form a complete displaying image. The present disclosure does not limit a specific first direction.

Figure 4:
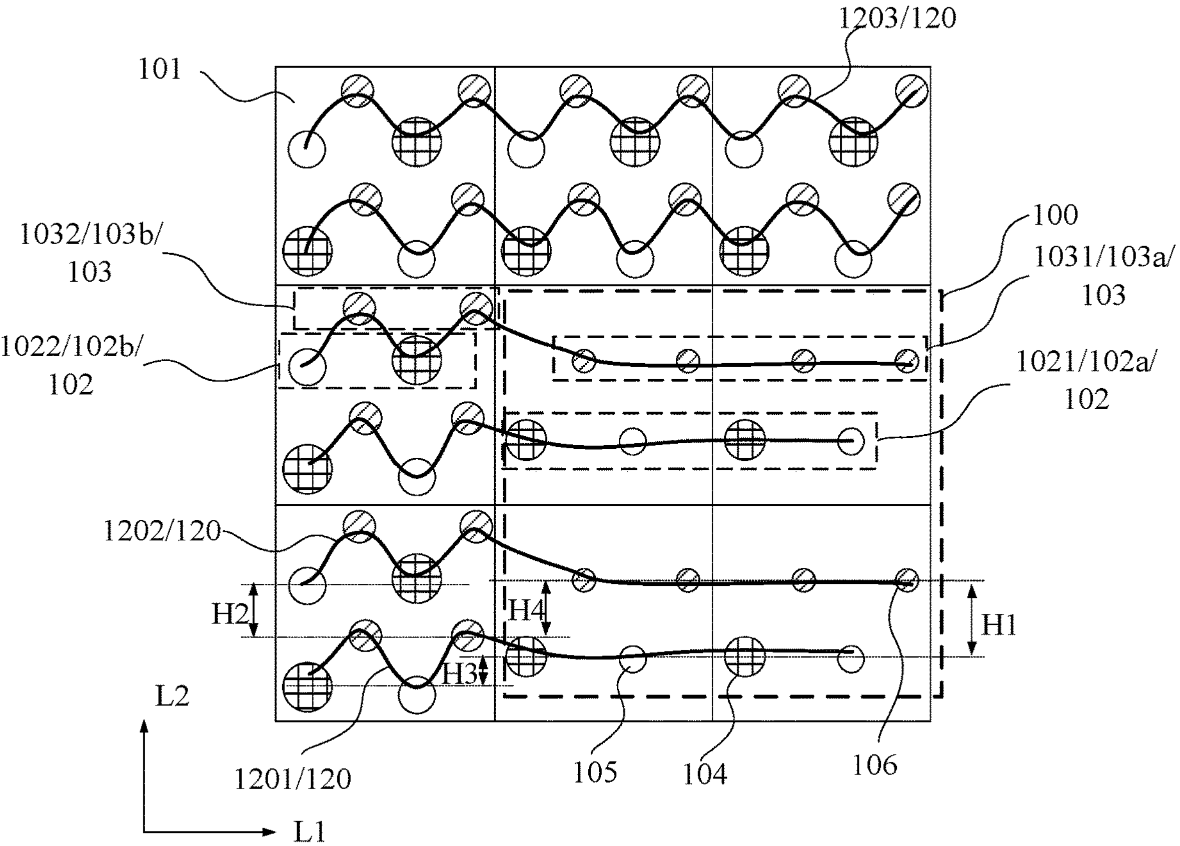
FIG. 4 shows a schematic diagram of pixel arrangement of a display panel consistent with the disclosed embodiments of the present disclosure.

FIG. 4 shows a schematic diagram of pixel arrangement of a display panel consistent with the disclosed embodiments of the present disclosure. As shown in FIG. 4, the first pixel rows include a first sub-pixel row 1021 and a second sub-pixel row 1022. The first sub-pixel row 1021 is located in the first display area 100, and the second sub-pixel row 1022 is located in the second display area 101. In FIG. 4, the first sub-pixel row 1021 and the second sub-pixel row 1022 may not be located on a same straight line along the second direction L2.

In one embodiment, as an example for description, the signal line is the scan line 120. The first sub-pixel row 1021 in the first display area 100 and the second sub-pixel row 1022 in the second display area 101 are electrically connected to a same scan line 1201. That is, the first direction L1 is the extension direction of the scan line 120. The first sub-pixel row 1021 and the second sub-pixel row 1022 are connected to the scan line 1201 extending along the first direction L1. Along the second direction L2, the spacing between the first sub-pixel row 1021 and the second sub-pixel row 1022 is the third spacing H3, and the third spacing H3 is greater than zero. That is, the first sub-pixel row 1021 and the second sub-pixel row 1022 are not located on a same straight line along the first direction L1. On the one hand, when the signal line is the data line 121, that is, the first direction L1 is the extension direction of the data line 121, data signals may be transmitted to the first sub-pixel row 1021 and second sub-pixel row 1022 through the same data line 121. On the other hand, when the signal line is the scan line 120, the first sub-pixel row 1021 and the second sub-pixel row 1022 may be driven simultaneously to perform display. Accordingly, simultaneous display of the first display area and the second display area may be achieved.

It should be noted that in FIG. 4, as an example, the first sub-pixel 104 is a blue sub-pixel, the second sub-pixel 105 is a red sub-pixel, and the third sub-pixel 106 is a green sub-pixel.

It may be understood that the scan line 1201 may also be electrically connected to the third sub-pixel 106 in the second display area 101. The pixel circuits in the display panel are generally arranged in a row-column matrix. FIG. 4 only illustrates the light-emitting elements in the sub-pixels and does not illustrate the pixel circuits. In addition, the sub-pixels controlled by a same scan line 120 are connected in series only with a same black solid line, which does not represent an actual wiring method of the scan line 120. In an actual display panel, the scan line 120 may generally be a straight-line wiring.

It may be understood that, with reference to FIG. 4, the third spacing H3 refers to the minimum spacing between the first sub-pixel row 1021 and the second sub-pixel row 1022. Specifically, the third spacing H3 is the minimum spacing between the center of the sub-pixel in the first sub-pixel row 1021 and the center of the sub-pixel in the second sub-pixel row 1022. In one embodiment, as shown in FIG. 4, in the first display area 100, the centers of the sub-pixels in the first sub-pixel row are located on a same straight line. In the second display area 101, the centers of the sub-pixels in the second sub-pixel row 1022 are not located on the same straight line. In some embodiments, referring to FIG. 4, along the second direction L2, the third spacing H3 may gradually increase or decrease. That is, in the second direction L2, the spacing between the adjacent first sub-pixel row 1021 and the second sub-pixel row 1022 (the third spacing H3) may be set to gradually increase or gradually decrease. As such, gradual change and transition in brightness may be achieved. Accordingly, the brightness difference between the first display area and the second display area perceived by the human eye may be alleviated, the problem of uneven display may be eased, and user experience may be improved.

In one embodiment, the display panel also includes a plurality of signal lines extending along the first direction. The signal line may be at least one of a data line or a scan line. The data line is configured to transmit image and video data. The scan line is configured to refresh the pixels on the display screen line by line. The scan lines may refresh the pixels line by line in a certain order to form a complete displaying image. As shown in FIG. 4, the second pixel row includes a third sub-pixel row 1031 and a fourth sub-pixel row 1032. The third sub-pixel row 1031 is disposed in the first display area 100. The fourth sub-pixel row 1032 is disposed in the second display area 101. Since the second spacing H2 is smaller than the first spacing H1, the third sub-pixel row 1031 and the fourth sub-pixel row 1032 may not be located on a same straight line along the first direction L1.

In one embodiment, as an example for description, the signal line is the scan line 120. The third sub-pixel row 1031 in the first display area 100 and the fourth sub-pixel row 1032 in the second display area may be electrically connected to a same scan line 1202. The first direction L1 is and extension direction of the scan line. The third sub-pixel row 1031 and the fourth sub-pixel row 1032 are connected to the scan line 120 extending along the first direction L1. Along the second direction L2, the spacing between the third sub-pixel row 1031 and the fourth sub-pixel row 1032 is a fourth spacing H4, and the fourth spacing H4 is greater than zero. That is, the third sub-pixel row 1031 and the fourth sub-pixel row 1032 are not located on a same straight line along the first direction L1. When the signal line is the data line 121, that is, the first direction L1 is the extension direction of the data line 121, data signals may be transmitted to the third sub-pixel row 1031 and fourth sub-pixel row 1032 through the same data line 121. In the case where the signal line is a scan line, the third sub-pixel row 1031 and the fourth sub-pixel row 1032 may be driven simultaneously for display. Accordingly, simultaneous display of the first display area and the second display area may be achieved.

It may be understood that the scan line 1202 may also be electrically connected to the first sub-pixel 104 and the second sub-pixel 105 in the second display area 101. The scan line 120 may also include a scan line 1203. Along the second direction L2, the scan line 1203 is disposed in the second display area 101 and overlaps with the first display area 100. The scan line 1203 is electrically connected to the first sub-pixel 104, the second sub-pixel 105 and the third sub-pixel 106.

In some embodiments, referring to FIG. 4, the fourth spacing H4 may gradually increase or gradually decrease along the second direction L2. That is, in the second direction L2, the spacing between the adjacent third sub-pixel row 1031 and the fourth sub-pixel row 1032 (the fourth spacing H4) may be set to gradually increase or gradually decrease. As such, gradual change and transition in brightness may be achieved. Accordingly, the brightness difference between the first display area and the second display area perceived by the human eye may be alleviated, and user experience may be improved.

A sub-pixel may include a light-emitting element and a pixel circuit. The sub-pixel may be one of the first sub-pixel, the second sub-pixel and the third sub-pixel. The light-emitting element may be an electronic device capable of emitting visible light or light in other wavelength ranges. The light-emitting element may be at least one of a light-emitting diode, an organic light-emitting diode, and a laser diode. The pixel circuit refers to an electronic circuit configured to process and control a pixel on a display device. The pixel circuit may include a pixel driver, a pixel selector, a pixel controller and other components, and is configured to control the brightness and color of each pixel to achieve image display. To improve the display effect and lifespan of the display panel, the pixel circuit and the light-emitting element may be electrically connected in one-to-one correspondence. One pixel circuit drives one of the light-emitting elements to emit light, that is, in a "one-drive-one" driving method.

Figure 5:
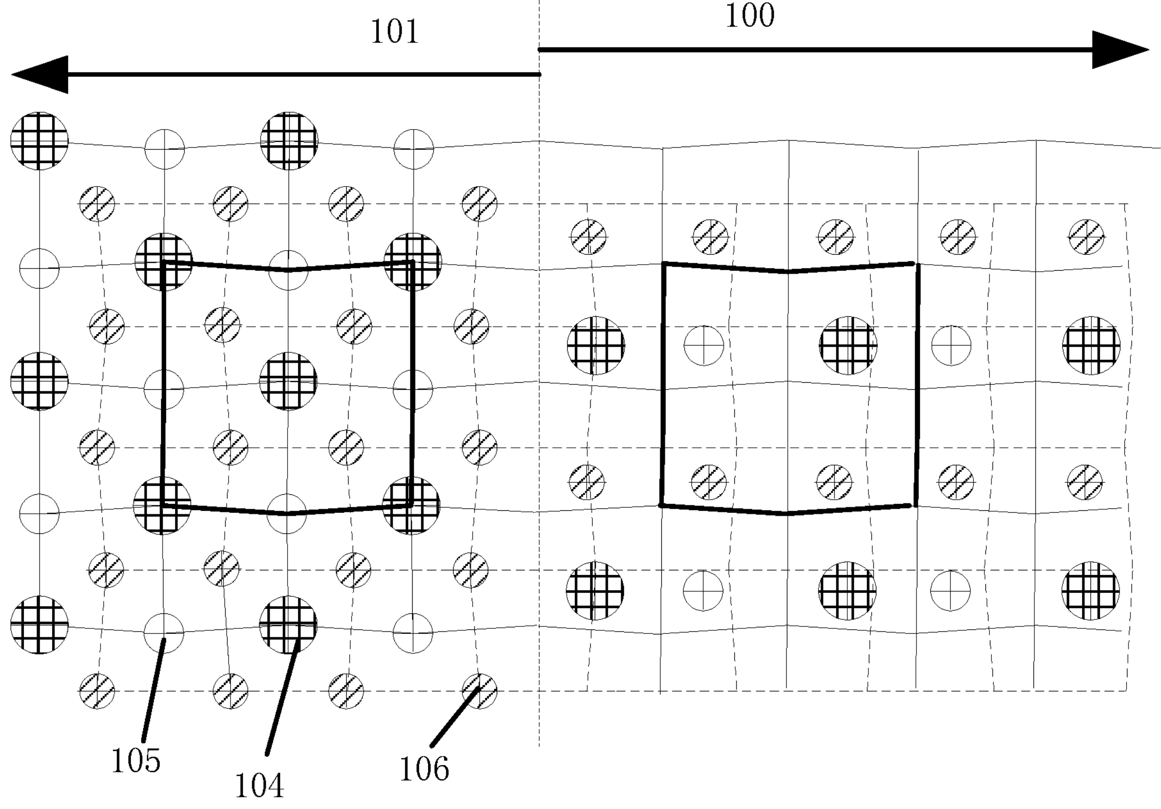
FIG. 5 shows a schematic diagram of pixel arrangement of another display panel consistent with the disclosed embodiments of the present disclosure.

FIG. 5 shows a schematic diagram of pixel arrangement of another display panel consistent with the disclosed embodiments of the present disclosure. As shown in FIG. 5, in a unit area, the quantity of sub-pixels in the first display area 100 may be less than the quantity of sub-pixels in the second display area 101. The unit area refers to an area of a same size in the first display area and the second display area. That is to say, the sub-pixel density of the first display area 100 may be smaller than the sub-pixel density of the second display area 101. The quantity of sub-pixels is a sum of the quantities of the first sub-pixel 104, the second sub-pixel 105 and the third sub-pixel 106. To increase a screen-to-body ratio of the display panel, optical collection elements (such as cameras, fingerprint recognition sensors and other devices that use optical signals) may be placed in a position that overlaps with the display area, for example, the first display area. By reducing the quantity of sub-pixels in the first display area per unit area, more light may pass through the display panel. Accordingly, the transmittance of the display panel may be increased, and the optical signal collection effect may be improved.

It may be understood that by reducing the pixel density in the first display area of the display panel, the light transmittance of the optical element may be improved. However, at a junction of the first display area and the second display area, a sudden change in pixel density may cause uneven display, such as a split-screen phenomenon. In the present disclosure, the pixel arrangement may be adjusted by making the second spacing H2 (the spacing between the adjacent first pixel row 102 and the second pixel row 103 in the second display area 101) smaller than the first spacing H1 (the spacing between the adjacent first pixel row 102 and the second pixel row 103 in the first display area 100). As such, the split-screen phenomenon in the first display area and the second display area may be visually alleviated, and user experience may be improved. Within a unit area, the quantity of sub-pixels in the first display area 100 may be greater than or equal to half of the quantity of sub-pixels in the second display area 101. The quantity of sub-pixels is a sum of the quantities of the first sub-pixels, the second sub-pixels and the third sub-pixels. That is to say, within a unit area, the quantity of sub-pixels in the second display area 101 may be twice the quantity of sub-pixels in the first display area 100. Such a design may improve the light transmittance rate of the display panel, and simultaneously alleviate the split-screen phenomenon that occurs in the first display area and the second display area. In addition, the manufacturing difficulty of the display panel may also be reduced.

Figure 6:
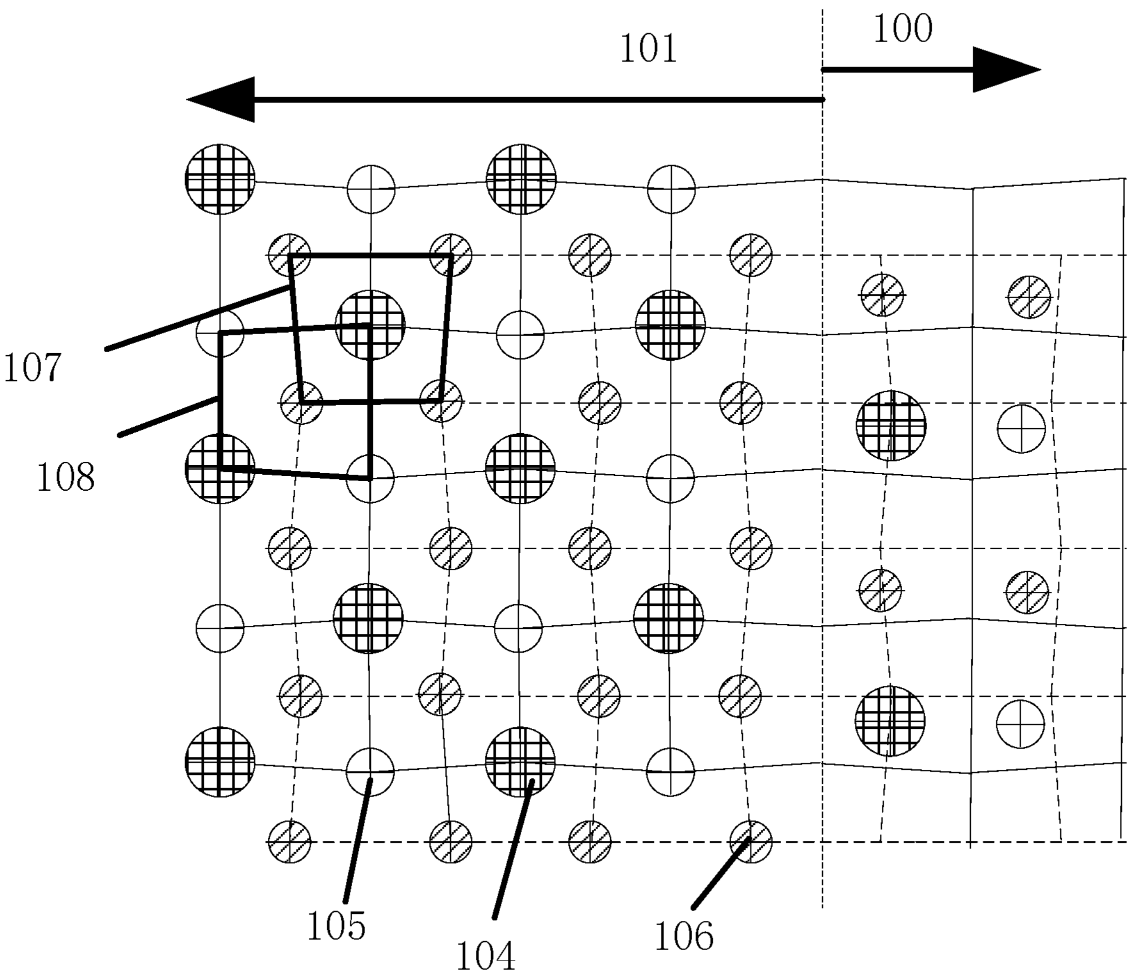
FIG. 6 shows a schematic diagram of pixel arrangement of a second display area of a display panel consistent with the disclosed embodiments of the present disclosure.

FIG. 6 shows a schematic diagram of pixel arrangement of a second display area of a display panel consistent with the disclosed embodiments of the present disclosure. In another embodiment, as shown in FIG. 6, in the second display area, four third sub-pixels 106 in two adjacent second pixel rows form a first virtual trapezoid 107. The centers of the four third sub-pixels 106 are respectively at the vertices of the first virtual trapezoid 107. That is to say, the center points of the four third sub-pixels 106 form the first virtual trapezoid 107. There is one first sub-pixel 104 located inside the first virtual trapezoid 107. In the second display area, two first sub-pixels 104 and two second sub-pixels 105 of two adjacent first pixel rows form a second virtual trapezoid 108. That is to say, the center points of the two first sub-pixels 104 and the center points of the two second sub-pixels 105 together form the second virtual trapezoid 108. There is a third sub-pixel 106 inside the second virtual trapezoid 108. The centers of the two first sub-pixels 104 are respectively located at the first vertices of the second virtual trapezoid 108, and the centers of the two second sub-pixels 105 are respectively located at the second vertices of the second virtual trapezoid 108. The line connecting the center point of one first sub-pixel 104 and the center point of the second sub-pixel 105 forms the virtual upper base of the second virtual trapezoid 108. The line connecting the center point of another first sub-pixel 104 and the center point of another second sub-pixel 105 forms the virtual bottom of the second virtual trapezoid 108. A line connecting the center point of one first sub-pixel 104 and the center point of another second sub-pixel 105 forms a virtual waist of the second virtual trapezoid 108. A line connecting the center point of another first sub-pixel 104 and the center point of one second sub-pixel 105 forms another virtual waist of the second virtual trapezoid 108. The first and second vertices alternate and are spaced apart.

In the above configuration, on the one hand, since four third sub-pixels form the first virtual trapezoid, at least one third sub-pixel of the four third sub-pixels is offset, and the quantity of separately exposed third sub-pixels may decrease. Accordingly, the color fringing phenomenon in the second display area may be alleviated. On the other hand, since the centers of the two first sub-pixels and the two second sub-pixels form the second virtual trapezoid, the first sub-pixel or the second sub-pixel is offset, and thus the color fringing phenomenon in the second display area may be reduced.

It should be noted that, a center of a sub-pixel may be defined as a center point of the sub-pixel geometry, that is, a geometric center. A gravity center of a sub-pixel may be defined as a center point of the mass distribution of the sub-pixel geometry, that is, a mass center. When the geometric shape of the sub-pixel is a regular geometric shape, the geometric center of the sub-pixel coincides with the gravity center of the sub-pixel. For example, when the shape of a sub-pixel is a parallelogram, the intersection of the two diagonals of the parallelogram is the geometric center and the gravity center of the parallelogram. When the geometric shape of the sub-pixel is an asymmetric and irregular geometric shape, the gravity center of the sub-pixel may be determined through related technologies. However, the geometric center of the sub-pixel may be difficult to determine. In this case, the relative positional relationship between the geometric center of the sub-pixel and the gravity center of the sub-pixel may be difficult to determine.

It should be noted that a regular graph (regular geometric shape) in the present disclosure satisfy at least one of the following conditions: 1) a centrosymmetric graph; 2) an axisymmetric graph with more than two axes of symmetry. For example, ovals, parallelograms (non-rectangular and non-rhombus), circles, rounded rectangles, regular polygons, rectangles, and rhombuses each are regular graphs. For a centrosymmetric graph, the central symmetry point is the center (gravity center). For an axisymmetric graph with more than two axes of symmetry, the intersection point of the two axes of symmetry is the center (gravity center). Graphs other than regular graphs may be referred to as non-regular graphs.

Figure 7:
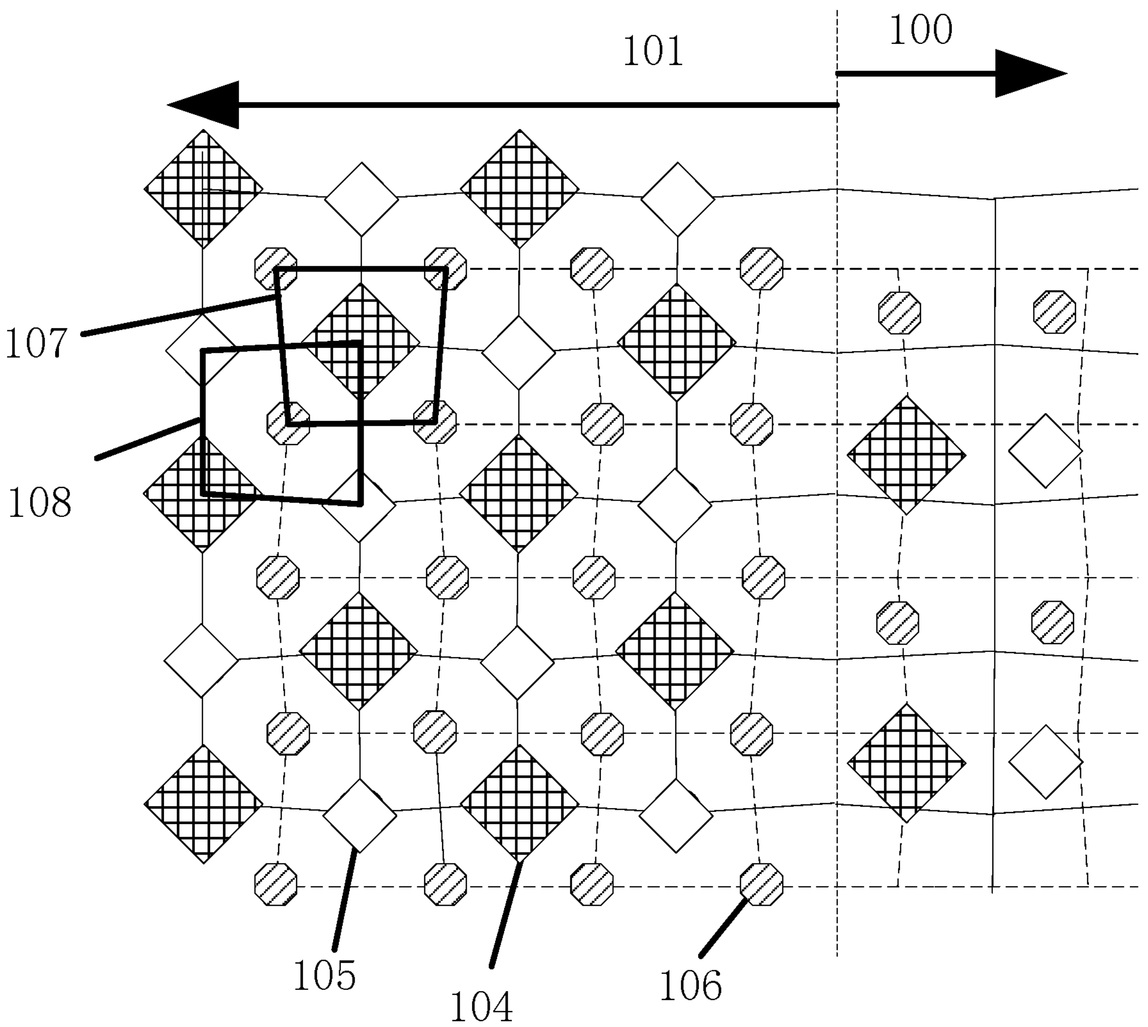
FIG. 7 shows a schematic diagram of pixel arrangement of a second display area of another display panel consistent with the disclosed embodiments of the present disclosure.

FIG. 7 shows a schematic diagram of pixel arrangement of a second display area of another display panel consistent with the disclosed embodiments of the present disclosure. In one embodiment, taking the first sub-pixel 104 as an example, as shown in FIG. 7, the opening shape of the first sub-pixel 104 may be a square. The geometric center of the first sub-pixel 104 coincides with the gravity center of the first sub-pixel 104, specifically, the intersection of the two diagonals of the square (that is, the centrosymmetric point).

Figure 8:
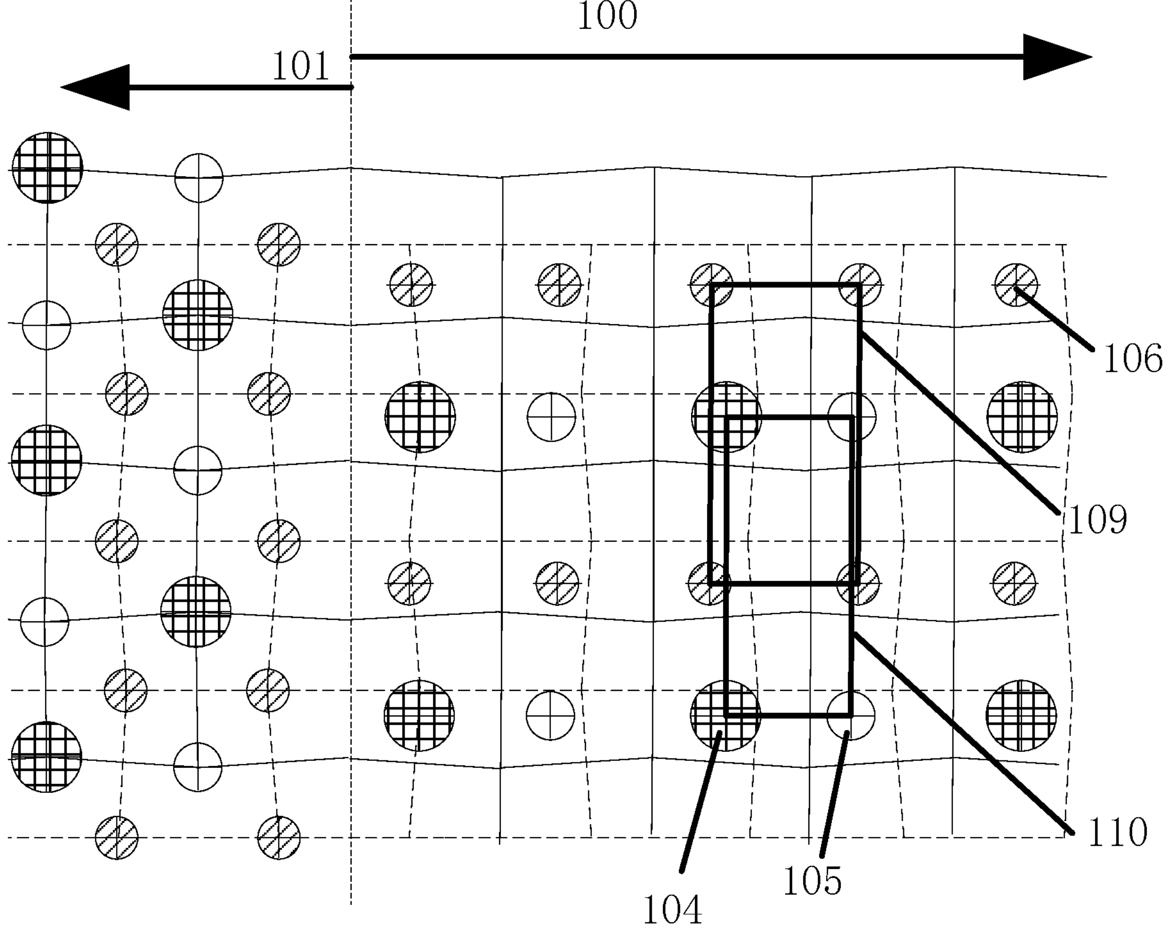
FIG. 8 shows a schematic diagram of pixel arrangement of a first display area of a display panel consistent with the disclosed embodiments of the present disclosure.

FIG. 8 shows a schematic diagram of pixel arrangement of a first display area of a display panel consistent with the disclosed embodiments of the present disclosure. In one embodiment, as shown in FIG. 8, in the first display area, four third sub-pixels 106 in two adjacent second pixel rows form a first virtual parallelogram 109, and the centers of the four third sub-pixels 106 are respectively at the vertices of the first virtual parallelogram 109. That is to say, the center points of the four third sub-pixels 106 form the first virtual parallelogram 109. The first sub-pixel 104 and the second sub-pixel 105 each intersect with two opposite virtual sides of the first virtual parallelogram 109. That is, the line connecting the center of the first sub-pixel 104 and the center of the second sub-pixel 105 intersects with the two virtual sides of the first virtual parallelogram 109. The center of the first sub-pixel 104 and the center of the second sub-pixel 105 each are located inside the first virtual parallelogram 109. The spacing along the first direction between adjacent first sub-pixels 104 and second sub-pixels 105 is less than the spacing between adjacent third sub-pixels 106.

In the first display area, two first sub-pixels 104 and two second sub-pixels 105 in two adjacent first pixel rows form a second virtual parallelogram 110. The center of the second sub-pixel 105 is at the first vertex of the second virtual parallelogram 110. The center of the first sub-pixel 104 is at the second vertex of the second virtual parallelogram 110. The center points of the two first sub-pixels 104 and the center points of the two second sub-pixels 105 together form the second virtual parallelogram 110. The two first vertices are adjacent, and the two second vertices are adjacent. The two third sub-pixels 106 each intersect with two opposite virtual sides of the second virtual parallelogram 110. That is, the line connecting the center points of the two third sub-pixels 106 intersects with the two virtual sides of the second virtual parallelogram 110. The centers of the two third sub-pixels 106 are outside the second virtual parallelogram 110. The spacing along the first direction between adjacent first sub-pixel 104 and second sub-pixel 105 is less than the spacing between adjacent third sub-pixels 106.

In the above configuration, on the one hand, since four third sub-pixels form the first virtual parallelogram, at least two third sub-pixels of the four third sub-pixels are offset, and the quantity of separately exposed third sub-pixels may decrease. Accordingly, the color fringing phenomenon in the first display area may be alleviated. On the other hand, since the centers of the two first sub-pixels and the two second sub-pixels form the second virtual parallelogram 110, the first sub-pixel or the second sub-pixel may be offset, and thus the color fringing phenomenon in the first display area may be alleviated.

Figure 9:
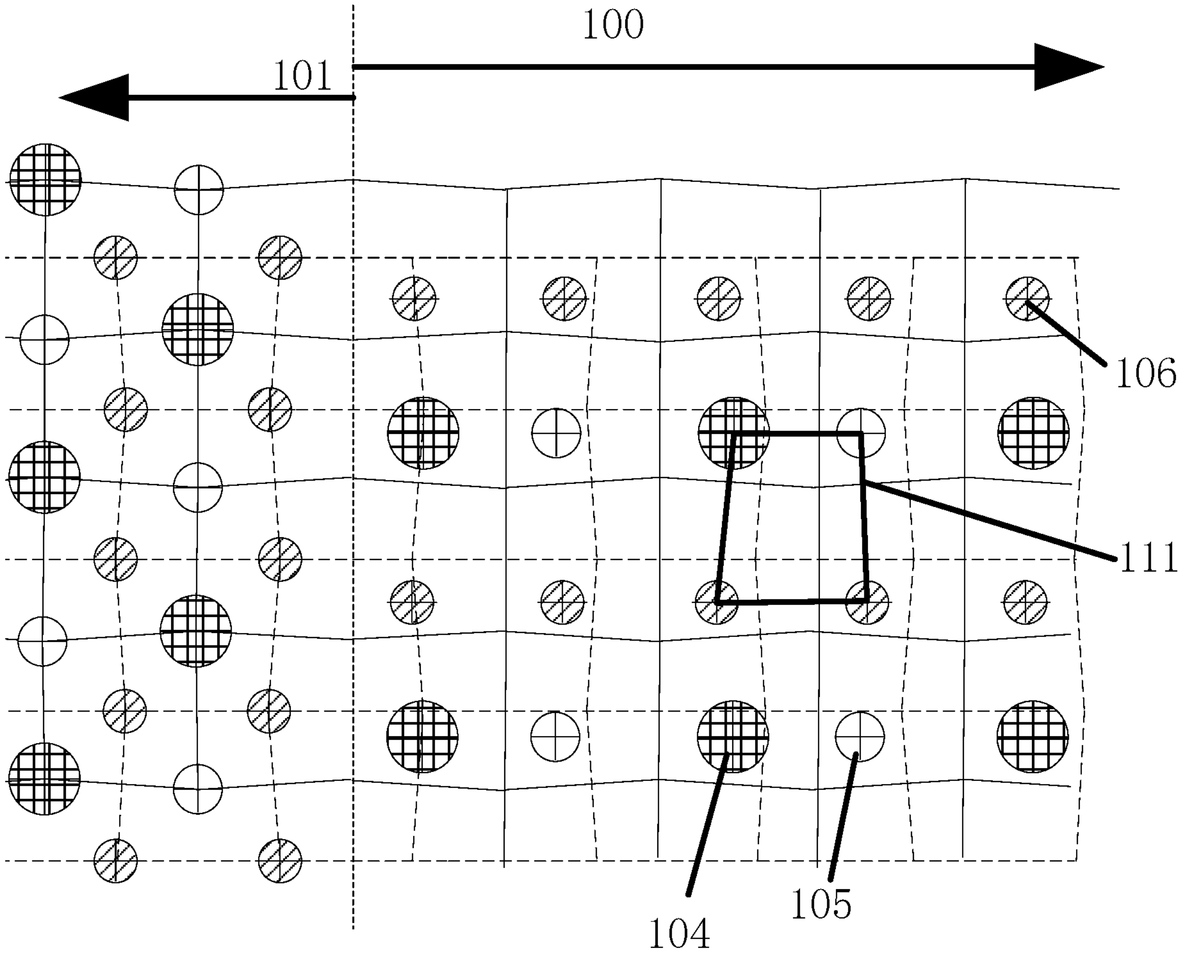
FIG. 9 shows a schematic diagram of pixel arrangement of a first display area of another display panel consistent with the disclosed embodiments of the present disclosure.

FIG. 9 shows a schematic diagram of pixel arrangement of a first display area of another display panel consistent with the disclosed embodiments of the present disclosure. As shown in FIG. 9, in the first display area, one first sub-pixel 104, one second sub-pixel 105 and two third sub-pixels 106 in adjacent first pixel row and the second pixel row form a third virtual trapezoid 111. That is, the center point of one first sub-pixel 104, the center point of one second sub-pixel 105, and the center points of two third sub-pixels 106 form the third virtual trapezoid 111. The center of the first sub-pixel 104, the center of the second sub-pixel 105 and the centers of the two third sub-pixels 106 are respectively located at the vertices of the third virtual trapezoid 111. In this configuration, since the first sub-pixel, the second sub-pixel, and the two third sub-pixels form the third virtual trapezoid, at least one of the first sub-pixel, the second sub-pixel and the two third sub-pixels is offset. Accordingly, the quantity of individually exposed sub-pixels may decrease, and the color fringing phenomenon in the first display area may be alleviated.

Figure 10:
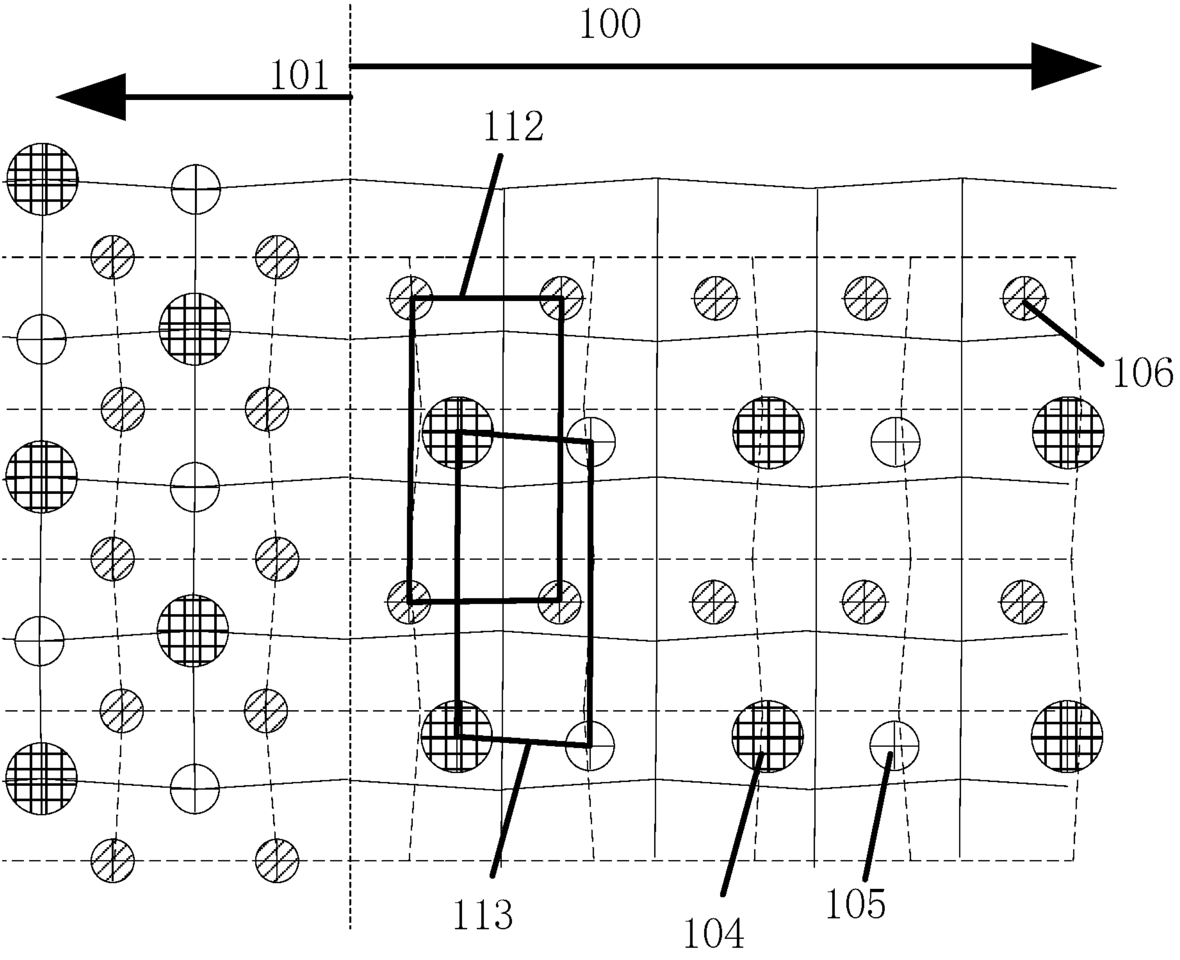
FIG. 10 shows a schematic diagram of pixel arrangement of a first display area of another display panel consistent with the disclosed embodiments of the present disclosure.

FIG. 10 shows a schematic diagram of pixel arrangement of a first display area of another display panel consistent with the disclosed embodiments of the present disclosure. As shown in FIG. 10, to refine the arrangement of the first sub-pixel, the second sub-pixel and the third sub-pixel in the first display area, in the first display area, four third sub-pixels 106 in two adjacent second pixel rows form a third virtual parallelogram 112. The centers of the four third sub-pixels 106 are respectively at the vertices of the third virtual parallelogram 112. Lines connecting the center points of the four third sub-pixels 106 form the third virtual parallelogram 112, and a first sub-pixel 104 is located inside the third virtual parallelogram 112. In one embodiment, the first sub-pixel 104 may be located at the center point of the third virtual parallelogram 112. In the first display area, two first sub-pixels 104 and two second sub-pixels 105 in two adjacent first pixel rows form a fourth virtual parallelogram 113. The center points of the two first sub-pixels 104 and the center points of the two second sub-pixels 105 form the fourth virtual parallelogram 113. The center of the second sub-pixel 105 is at the first vertex of the fourth virtual parallelogram 113, and the center of the first sub-pixel 104 is at the second vertex of the fourth virtual parallelogram 113. The two first vertices are adjacent, and the two second vertices are adjacent. The third sub-pixel 106 is inside the fourth virtual parallelogram 113. In one embodiment, the third sub-pixel 106 may be located at the center point of the fourth virtual parallelogram 113.

In the above solution, since four third sub-pixels form a third virtual parallelogram, at least two of the third sub-pixels are offset. Accordingly, the quantity of independently exposed third sub-pixels may decrease, and the color fringing phenomenon in the first display area may be alleviated. In addition, since two first sub-pixels and two second sub-pixels form a fourth virtual parallelogram, at least two sub-pixels of the first sub-pixels and the second sub-pixels are offset. Accordingly, the quantity of individually exposed sub-pixels may decrease, and the color fringing phenomenon in the first display area may be alleviated.

Figure 11:
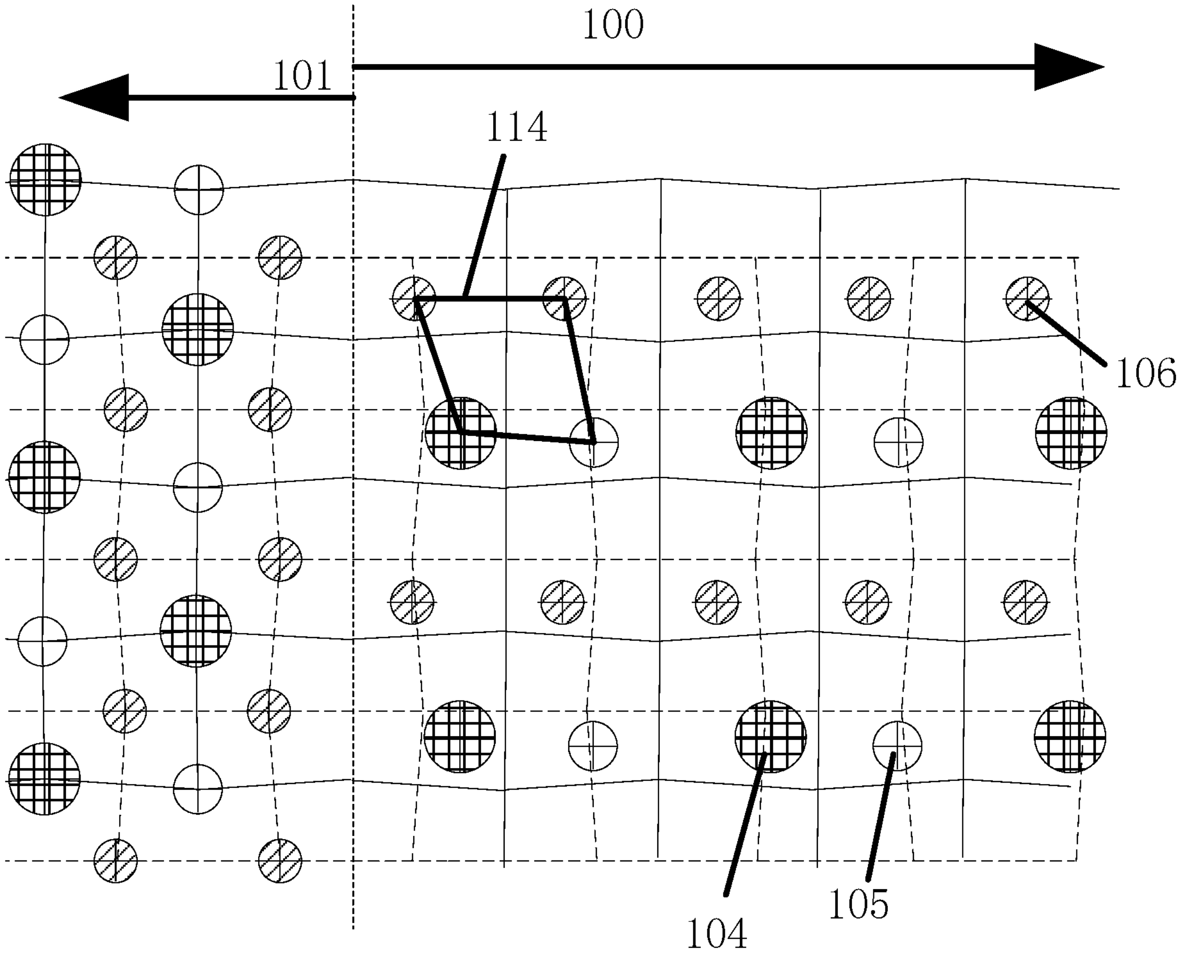
FIG. 11 shows a schematic diagram of pixel arrangement of a first display area of another display panel consistent with the disclosed embodiments of the present disclosure.

FIG. 11 shows a schematic diagram of pixel arrangement of a first display area of another display panel consistent with the disclosed embodiments of the present disclosure. In some other embodiments, as shown in FIG. 11, one first sub-pixel 104, one second sub-pixel 105 and two third sub-pixels 106 in adjacent first pixel row and the second pixel row may form a virtual quadrilateral 114. The connection line between the center point of the first sub-pixel 104, the center point of the second sub-pixel 105 and the center points of the two third sub-pixels 106 form the virtual quadrilateral 114. The center of the first sub-pixel 104, the center of the second sub-pixel 105 and the centers of the two third sub-pixels 106 are respectively located at the vertices of the virtual quadrilateral 114. In this configuration, since one first sub-pixel, one second sub-pixel and two third sub-pixels form a virtual quadrilateral, at least three sub-pixels of the four sub-pixels are offset, and the color fringing phenomenon in the first display area may be alleviated.

Figure 12:
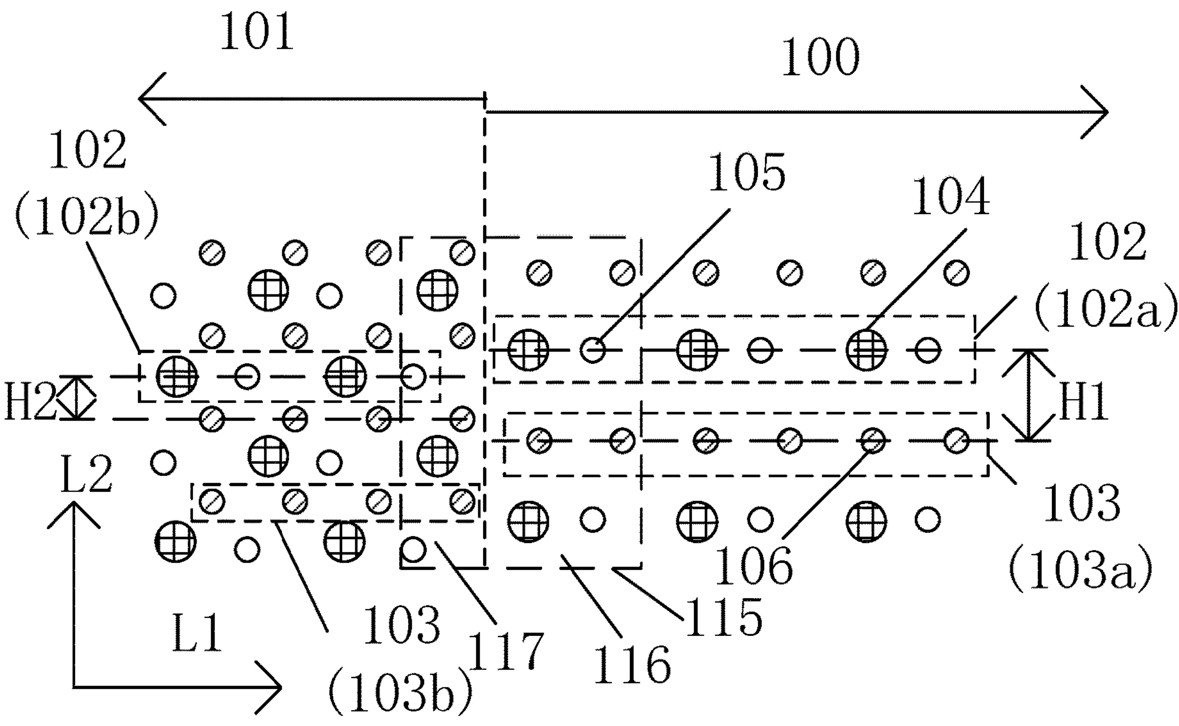
FIG. 12 illustrates a schematic structural diagram of another display panel consistent with the disclosed embodiments of the present disclosure.
Figure 13:
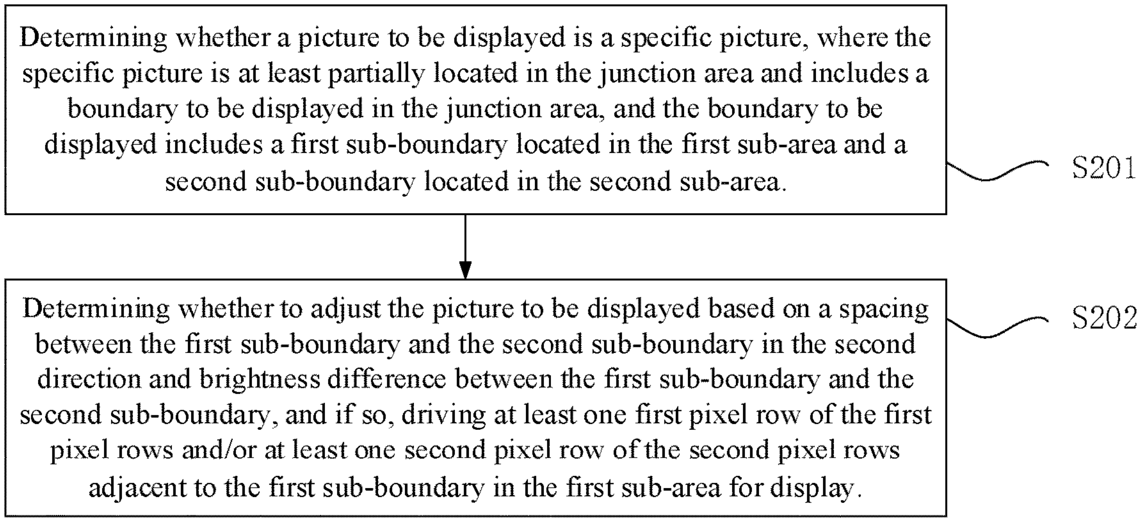
FIG. 13 illustrates a schematic flowchart of a driving method for a display panel consistent with the disclosed embodiments of the present disclosure.

The present disclosure also provides a driving method for a display panel. The method may be used for driving a display panel provided by the present disclosure. FIG. 12 illustrates a schematic structural diagram of another display panel consistent with the disclosed embodiments of the present disclosure. As shown in FIG. 12, the display panel includes a junction area 115. The junction area 115 includes a first sub-area 116 and a second sub-area 117 that are adjacent along the first direction L1. The first sub-area 116 is located in the first display area 100, and the second sub-area 117 is located in the second display area 101. FIG. 13 illustrates a schematic flowchart of a driving method for a display panel consistent with the disclosed embodiments of the present disclosure. As shown in FIG. 13, the driving method includes steps S201 and S202.

Step S201, determining whether a picture to be displayed is a specific picture. The specific picture is at least partially located in the junction area and has a boundary to be displayed in the junction area. During an actual display process of the display panel, the specific picture refers to a picture in which the pixels on a straight line along the first direction in the first display area and the second display area are misaligned. The boundary to be displayed may include a first sub-boundary located in the first sub-area and a second sub-boundary located in the second sub-area. The present disclosure does not limit the positions and shapes of the first sub-boundary and second sub-boundary. The first sub-boundary may be an upper boundary, lower boundary, left boundary or right boundary of the first sub-area. The first sub-boundary may be a straight boundary or a curved boundary. The second sub-boundary may be an upper boundary, lower boundary, left boundary or right boundary of the second sub-area. The second sub-boundary may be a straight boundary or a curved boundary.

Specifically, as shown in FIG. 1, the first display area 100 and the second display area 101 each include a plurality of first pixel rows 102 and a plurality of second pixel rows 103. Along the second direction L2, the spacing between the adjacent first pixel row 102 and the second pixel row 103 in the first display area 100 is the first spacing H1. The spacing between the adjacent first pixel row 102 and the second pixel row 103 in the second display area 101 is the second spacing H2. The second spacing H2 is smaller than the first spacing H1. That is to say, the spacing between two adjacent pixel rows (first pixel rows 102 and second pixel rows 103) in the second display area 101 is smaller. The spacing between two adjacent pixel rows (first pixel rows 102 and second pixel rows 103) in the first display area 100 is larger. The sub-pixel densities of the first display area and the second display area are not same. Accordingly, the split-screen phenomenon occurring in the first display area and the second display area may be alleviated. However, due to the misalignment of the pixels in the first display area and the second display area, display misalignment may occur in some specific display images. The present disclosure provides a driving method for a display panel to alleviate the misalignment phenomenon.

Step S202, determining whether to adjust the picture to be displayed based on the spacing between the first sub-boundary and the second sub-boundary in the second direction and the brightness difference between the first sub-boundary and the second sub-boundary. In the case where the spacing in the second direction between the first sub-boundary and the second sub-boundary is large or the brightness difference between the first sub-boundary and the second sub-boundary is large, the display effect of the display panel may be affected, and the picture to be displayed needs to be adjusted. If so, the method may drive at least one row of first pixel rows and/or at least one row of second pixel rows adjacent to the first sub-boundary in the first sub-area for display. The first sub-pixel, the second sub-pixel and the third sub-pixel of the first sub-boundary may control the voltage of each data line and/or each scan line according to a specific driving method, and then control at least one row of first pixel rows and/or at least one row of second pixel rows adjacent to the first sub-boundary in the first sub-area for display.

Figure 14:
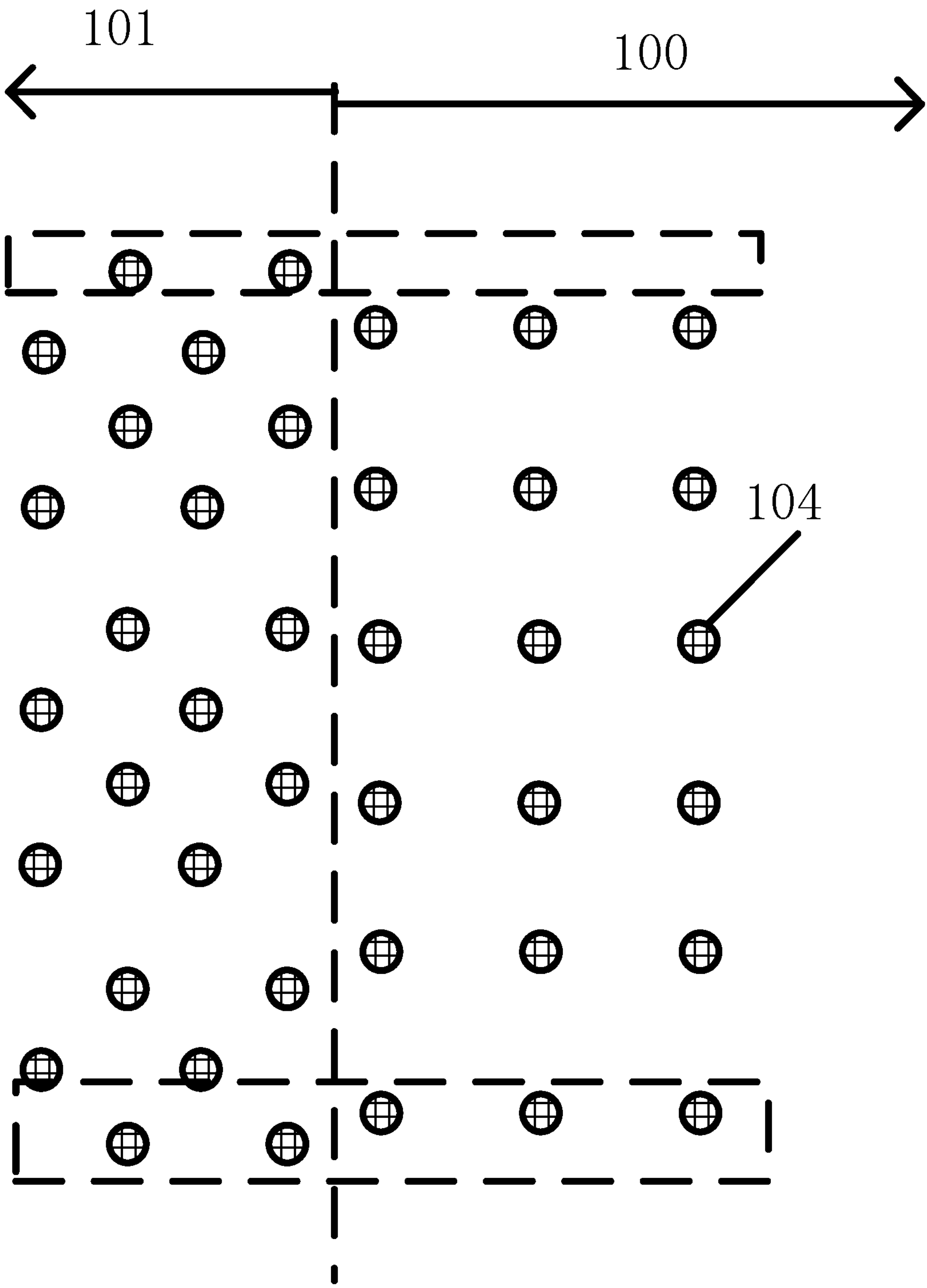
FIG. 14 illustrates a schematic diagram of pixel arrangement of a first sub-pixel of a display panel consistent with the disclosed embodiments of the present disclosure.
Figure 15:
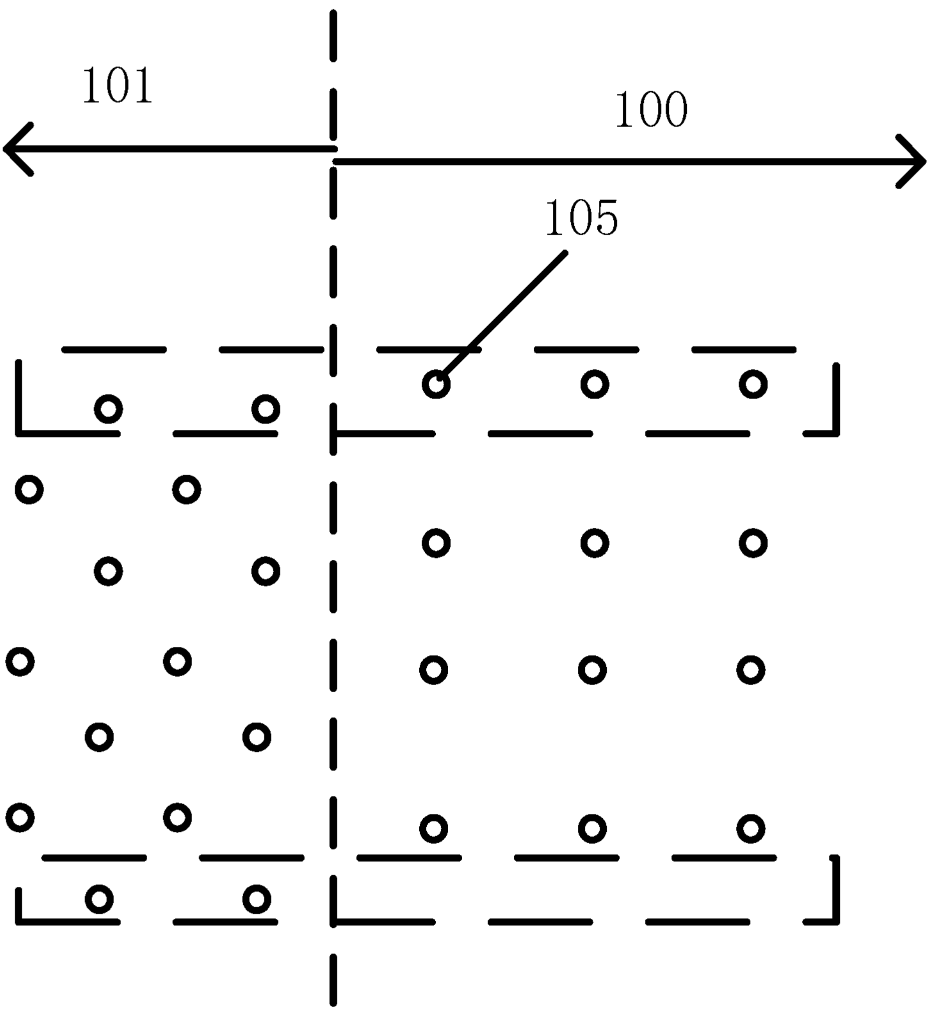
FIG. 15 illustrates a schematic diagram of pixel arrangement of a second sub-pixel of a display panel consistent with the disclosed embodiments of the present disclosure.
Figure 16:
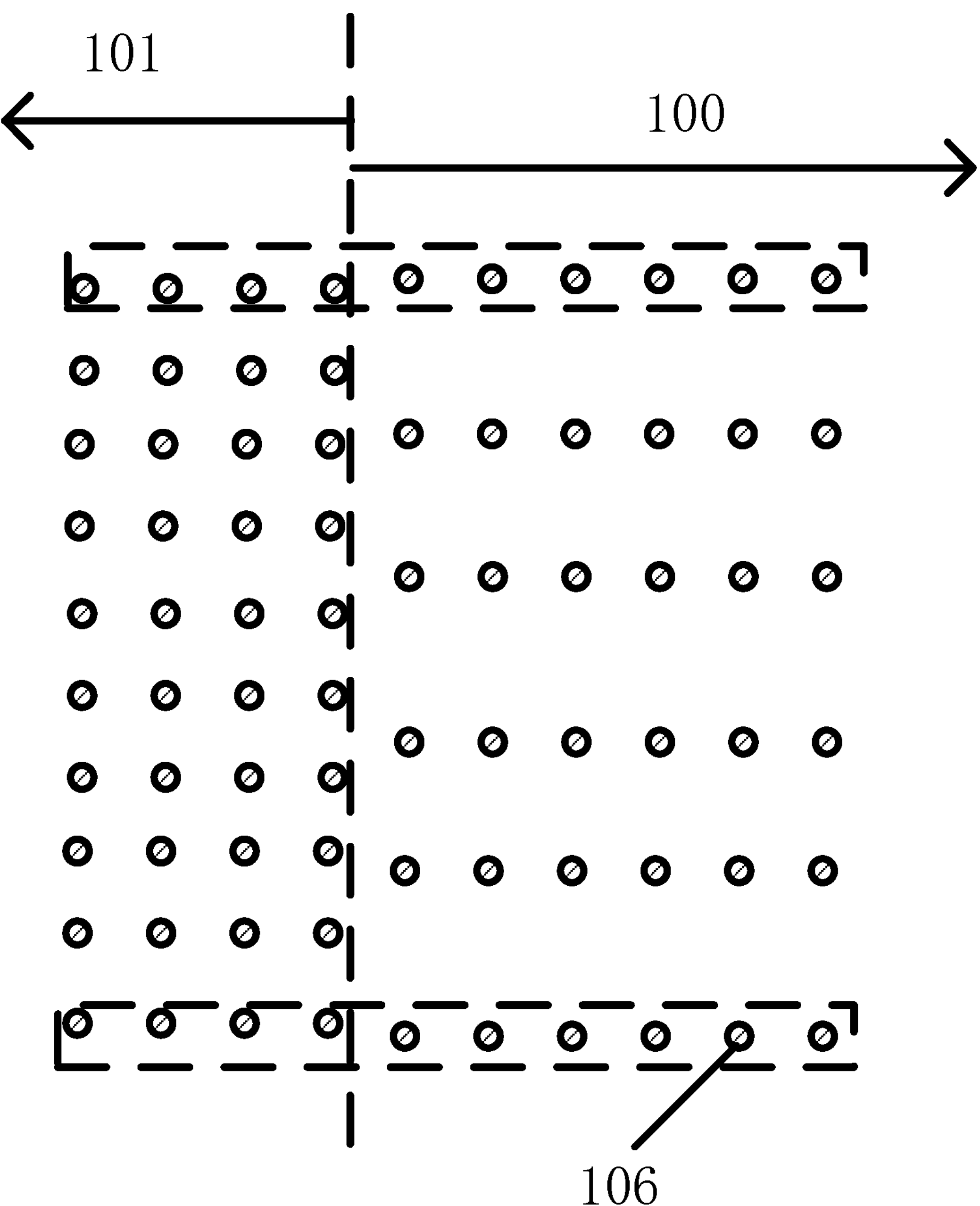
FIG. 16 illustrates a schematic diagram of pixel arrangement of a third sub-pixel of a display panel consistent with the disclosed embodiments of the present disclosure.

Specifically, the first display area and the second display area of different sub-pixel types may have different degrees of misalignment. FIG. 14 illustrates a schematic diagram of pixel arrangement of a first sub-pixel of a display panel consistent with the disclosed embodiments of the present disclosure. Taking the first sub-pixel as a B pixel as an example, as shown in FIG. 14, the first sub-pixels 104 on the top row of the first display area 100 are obviously misaligned with the first sub-pixels 104 on the top row of the second display area 101. The first sub-pixels 104 on the bottom row of the first display area 100 are slightly misaligned with the first sub-pixels 104 on the bottom row of the second display area 101. FIG. 15 illustrates a schematic diagram of pixel arrangement of a second sub-pixel of a display panel consistent with the disclosed embodiments of the present disclosure. Taking the second sub-pixel as an R pixel as an example, as shown in FIG. 15, the second sub-pixels 105 on the top row of the first display area 100 are slightly misaligned with the second sub-pixels 105 on the top row of the second display area 101. The second sub-pixels 105 on the bottom row of the first display area 100 are obviously misaligned with the second sub-pixels 105 on the bottom row of the second display area 101. FIG. 16 illustrates a schematic diagram of pixel arrangement of a third sub-pixel of a display panel consistent with the disclosed embodiments of the present disclosure. Taking the third sub-pixel as a G pixel as an example, as shown in FIG. 16, the misalignment of the third sub-pixels 106 between the top row of the first display area 100 and the top row of the second display area 101 is not obvious, and the misalignment of the third sub-pixels 106 between the bottom row and the bottom row of the second display area 101 is not obvious.

In the above configuration, the first pixel row in the display panel includes the first sub-pixels and the second sub-pixels alternately arranged along the first direction. The second pixel row includes a plurality of third sub-pixels arranged along the first direction. Along the second direction, the first spacing between adjacent first pixel row and second pixel row in the first display area is greater than the second spacing between adjacent first pixel row and second pixel row in the second display area. As such, the quantity of sub-pixels in the first display area per unit area may be smaller than the quantity of sub-pixels in the second display area. By reducing the quantity of sub-pixels in the first display area per unit area and adjusting the pixel arrangement, the display effect of the display panel may be improved. Simultaneously, the sub-pixels in the first display area and the sub-pixels in the second display area may be misaligned. Based on the spacing between the first sub-boundary and the second sub-boundary and the brightness difference between the first sub-boundary and the second sub-boundary, determination may be made on whether to adjust the picture to be displayed. The picture to be displayed may be adjusted by driving at least one row of the first pixel rows and/or at least one row of the second pixel rows adjacent to the first sub-boundary in the first sub-area. In this approach, the misalignment phenomenon between the first display area and the second display area may be alleviated, and the panel display quality may be improved.

In one embodiment, after step S202, the method also includes step S203: based on the spacing between the first sub-boundary and the second sub-boundary in the second direction and the brightness difference between the first sub-boundary and the second sub-boundary, determining whether to adjust the picture to be displayed. If so, at least one row of the first pixel rows and/or at least one row of the second pixel rows adjacent to the second sub-boundary in the second sub-area are driven for display. The first sub-pixel, the second sub-pixel, and the third sub-pixel of the second sub-boundary may control the voltage of each data line and/or each scan line according to a specific driving method, and then drive at least one row of the first pixel rows adjacent to the second sub-boundary in the second sub-area to display, or drive at least one row of the second pixel rows for display, or simultaneously drive at least one row of the first pixel rows and at least one row of the second pixel rows. By driving the first pixel row and the second pixel row adjacent to the second sub-boundary, the misalignment between the first display area and the second display area may be alleviated.

Specifically, a process of determining whether to adjust the picture to be displayed based on the spacing between the first sub-boundary and the second sub-boundary in the second direction may include follow approaches. In one situation, the spacing between the first sub-boundary and a preset boundary is greater than the spacing between the second sub-boundary and the preset boundary. When each sub-pixel of the second sub-boundary is driven to emit light, each sub-pixel of the first sub-boundary is not driven to emit light; or, each sub-pixel of the first sub-boundary and the second sub-boundary is driven to emit light simultaneously, and the luminous brightness of each sub-pixel of the first sub-boundary is smaller than the luminous brightness of each sub-pixel of the second sub-boundary. The preset boundary is a boundary in the first sub-area opposite to the first sub-boundary. In another situation, the spacing between the first sub-boundary and the preset boundary is less than the spacing between the second sub-boundary and the preset boundary. Each sub-pixel of the first sub-boundary and the second sub-boundary is driven to emit light simultaneously, and the luminous brightness of each sub-pixel of the second sub-boundary is smaller than the luminous brightness of each sub-pixel of the first sub-boundary; or each sub-pixel of the first sub-boundary, the second sub-boundary and a compensation boundary is driven simultaneously. The luminous brightness of each sub-pixel of the first sub-boundary is same as the luminous brightness of each sub-pixel of the second sub-boundary, and the luminous brightness of each sub-pixel of the compensation boundary is smaller than the luminous brightness of each sub-pixel of the first sub-boundary. The compensation boundary is a first sub-boundary in an adjacent sub-junction area, and the first sub-boundary is adjacent to the first sub-boundary in the target sub-junction area. The adjacent sub-junction area is a sub-junction area adjacent to the target sub-junction area, and the adjacent sub-junction area and the target sub-junction area have a same luminous color.

Step S202 may be implemented by step S2021: determining whether the spacing between the first sub-boundary and the second sub-boundary in the second direction is greater than a preset spacing. When the spacing between the first sub-boundary and the second sub-boundary in the second direction is small, the human eye may not be able to distinguish the misalignment between the first display area and the second display area. As such, there is no need to adjust the picture to be displayed. When the spacing between the first sub-boundary and the second sub-boundary in the second direction is large, the misalignment between the first display area and the second display area may be obvious, and the image to be displayed needs to be adjusted to alleviate the misalignment. The method may determine whether the image to be displayed needs to be adjusted based on the spacing between the first sub-boundary and the second sub-boundary in the second direction.

Step S202 may also be implemented by step S2022 and step S2023. Step S2022: obtaining a brightness difference value of the boundary to be displayed. The brightness difference value may be one of the following: difference between the brightness of a first position point of the first sub-boundary and the brightness of a second position point of the second sub-area, difference between the average brightness of the first sub-boundary and the average brightness of a target line segment of the second sub-area, and difference between the brightness of the first pixel point of the first sub-boundary and the brightness of a third position point of the second sub-area. The first position point and the second position point each are located on the first sub-boundary and are symmetrical with respect to a center line of the boundary area. The target line segment and the first sub-boundary are two line segments that are symmetrical about the center line of the boundary area. The first pixel point and the third position point are two pixel points that are symmetrical with respect to the center line of the boundary area. The second position point is on a straight line where the first sub-boundary is located. The target line segment is on a straight line where the first sub-boundary is located and has a same length as the first sub-boundary. Positions of the first pixel point and the third position point are symmetrical with respect to a junction in the target sub-junction area. The junction in the target sub-junction area is between and equidistant from the first sub-area and the second sub-area.

Step S2023: determining whether the brightness difference value between the first sub-boundary and the second sub-boundary is greater than a preset threshold, and if so, adjusting the picture to be displayed. The method may determine whether the picture to be displayed needs to be adjusted.

Figure 17:
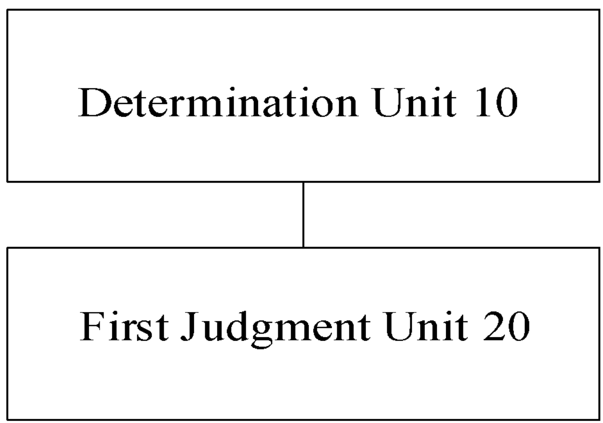
FIG. 17 illustrates a schematic structural diagram of a driving device of a display panel consistent with the disclosed embodiments of the present disclosure.

The present disclosure also provides a driving device, configured to drive a display panel provided by the present disclosure. As shown in FIG. 12, the display panel includes a junction area 115. The junction area 115 includes a first sub-area 116 and a second sub-area 117 that are adjacent along the first direction L1. The first sub-area 116 is located in the first display area 100, and the second sub-area 117 is located in the second display area 101. FIG. 17 illustrates a schematic structural diagram of a driving device of a display panel consistent with the disclosed embodiments of the present disclosure. As shown in FIG. 17, the driving device includes a determination unit 10 and a first judgement unit 20.

The determination unit 10 is configured to determine whether a picture to be displayed is a specific picture. The specific picture is at least partially located in the junction area and has a boundary to be displayed in the junction area. During an actual display process of the display panel, the specific picture refers to a picture in which the pixels on a straight line along the first direction in the first display area and the second display area are misaligned. The boundary to be displayed may include a first sub-boundary located in the first sub-area and a second sub-boundary located in the second sub-area. The present disclosure does not limit the positions and shapes of the first sub-boundary and second sub-boundary. The first sub-boundary may be an upper boundary, lower boundary, left boundary or right boundary of the first sub-area. The first sub-boundary may be a straight boundary or a curved boundary. The second sub-boundary may be an upper boundary, lower boundary, left boundary or right boundary of the second sub-area. The second sub-boundary may be a straight boundary or a curved boundary.

The first judgment unit 20 is configured to determine whether to adjust the picture to be displayed based on the spacing between the first sub-boundary and the second sub-boundary in the second direction and the brightness difference between the first sub-boundary and the second sub-boundary. In the case where the spacing in the second direction between the first sub-boundary and the second sub-boundary is large or the brightness difference between the first sub-boundary and the second sub-boundary is large, the display effect of the display panel may be affected, and the picture to be displayed needs to be adjusted. If so, at least one row of first pixel rows and/or at least one row of second pixel rows adjacent to the first sub-boundary in the first sub-area may be driven for display. The first sub-pixel, the second sub-pixel and the third sub-pixel of the first sub-boundary may control the voltage of each data line and/or each scan line according to a specific driving method, and then control at least one row of first pixel rows and/or at least one row of second pixel rows adjacent to the first sub-boundary in the first sub-area for display.

In the above solution, based on the brightness difference between the first sub-boundary and the second sub-boundary, determination may be made on whether to adjust the picture to be displayed. The picture to be displayed may be adjusted by driving at least one row of the first pixel rows and/or at least one row of the second pixel rows adjacent to the first sub-boundary in the first sub-area. In this approach, the misalignment phenomenon between the first display area and the second display area may be alleviated, and the panel display quality may be improved.

In one embodiment, the device also includes a second judgment unit. The second judgment unit is configured to determine whether to adjust the picture to be displayed, based on the spacing between the first sub-boundary and the second sub-boundary in the second direction and the brightness difference between the first sub-boundary and the second sub-boundary. If so, at least one row of the first pixel rows and/or at least one row of the second pixel rows adjacent to the second sub-boundary in the second sub-area are driven for display. The first sub-pixel, the second sub-pixel, and the third sub-pixel of the second sub-boundary may control the voltage of each data line and/or each scan line according to a specific driving method, and then drive at least one row of the first pixel rows adjacent to the second sub-boundary in the second sub-area to display, or drive at least one row of the second pixel rows for display, or simultaneously drive at least one row of the first pixel rows and at least one row of the second pixel rows. By driving the first pixel row and the second pixel row adjacent to the second sub-boundary, the misalignment between the first display area and the second display area may be alleviated.

Specifically, a process of determining whether to adjust the picture to be displayed based on the spacing between the first sub-boundary and the second sub-boundary in the second direction may include follow approaches. In one situation, the spacing between the first sub-boundary and a preset boundary is greater than the spacing between the second sub-boundary and the preset boundary. When each sub-pixel of the second sub-boundary is driven to emit light, each sub-pixel of the first sub-boundary is not driven to emit light; or, each sub-pixel of the first sub-boundary and the second sub-boundary is driven to emit light simultaneously, and the luminous brightness of each sub-pixel of the first sub-boundary is smaller than the luminous brightness of each sub-pixel of the second sub-boundary. The preset boundary is a boundary in the first sub-area opposite to the first sub-boundary. In another situation, the spacing between the first sub-boundary and the preset boundary is less than the spacing between the second sub-boundary and the preset boundary. Each sub-pixel of the first sub-boundary and the second sub-boundary is driven to emit light simultaneously, and the luminous brightness of each sub-pixel of the second sub-boundary is smaller than the luminous brightness of each sub-pixel of the first sub-boundary; or each sub-pixel of the first sub-boundary, the second sub-boundary and a compensation boundary is driven simultaneously. The luminous brightness of each sub-pixel of the first sub-boundary is same as the luminous brightness of each sub-pixel of the second sub-boundary, and the luminous brightness of each sub-pixel of the compensation boundary is smaller than the luminous brightness of each sub-pixel of the first sub-boundary. The compensation boundary is a first sub-boundary in an adjacent sub-junction area, and the first sub-boundary is adjacent to the first sub-boundary in the target sub-junction area. The adjacent sub-junction area is a sub-junction area adjacent to the target sub-junction area, and the adjacent sub-junction area and the target sub-junction area have a same luminous color.

In practical applications, a sub-pixel rendering (SPR) algorithm may be used to optimize the misalignment phenomenon. The SPR algorithm may turn on four consecutive gate lines simultaneously. Accordingly, the first display area may borrow sub-pixels of a same color from an upper or lower row. On a same pixel row, the pixels arranged in the sub-pixels of the second display area correspond to the third sub-pixels only, or the first sub-pixels and the second sub-pixels in the first display area. The gate line drives a first pixel row and a second pixel row.

The first judgment unit includes a first judgment module. The first judgment module is configured to determine whether the spacing between the first sub-boundary and the second sub-boundary in the second direction is greater than a preset spacing. When the spacing between the first sub-boundary and the second sub-boundary in the second direction is small, the human eye may not be able to distinguish the misalignment between the first display area and the second display area. As such, there is no need to adjust the picture to be displayed. When the spacing between the first sub-boundary and the second sub-boundary in the second direction is large, the misalignment between the first display area and the second display area may be obvious, and the image to be displayed needs to be adjusted to alleviate the misalignment. The device may determine whether the image to be displayed needs to be adjusted based on the spacing between the first sub-boundary and the second sub-boundary in the second direction.

The first judgment unit also includes an acquisition module and a second judgment module. The acquisition module is configured to obtain a brightness difference value of the boundary to be displayed. The brightness difference value may be one of the following: difference between the brightness of a first position point of the first sub-boundary and the brightness of a second position point of the second sub-area, difference between the average brightness of the first sub-boundary and the average brightness of a target line segment of the second sub-area, and difference between the brightness of the first pixel point of the first sub-boundary and the brightness of a third position point of the second sub-area. The first position point and the second position point each are located on the first sub-boundary and are symmetrical with respect to a center line of the boundary area. The target line segment and the first sub-boundary are two line segments that are symmetrical about the center line of the boundary area. The first pixel point and the third position point are two pixel points that are symmetrical with respect to the center line of the boundary area. The second position point is on a straight line where the first sub-boundary is located. The target line segment is on a straight line where the first sub-boundary is located and has a same length as the first sub-boundary. Positions of the first pixel point and the third position point are symmetrical with respect to a junction in the target sub-junction area. The junction in the target sub-junction area is between and equidistant from the first sub-area and the second sub-area. The second judgement module is configured to determine whether the brightness difference value between the first sub-boundary and the second sub-boundary is greater than a preset threshold, if so, adjust the picture to be displayed. The device may determine whether the picture to be displayed needs to be adjusted.

Figure 18:
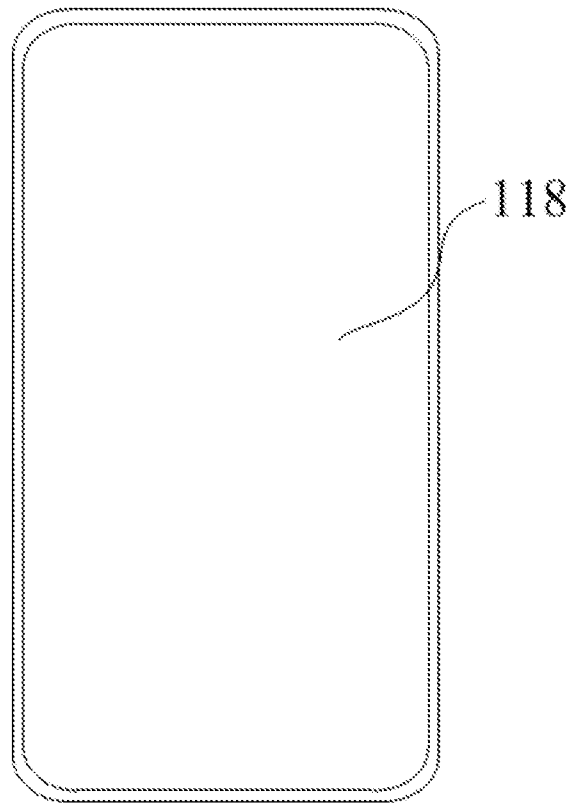
FIG. 18 illustrates a schematic structural diagram of a display device consistent with the disclosed embodiments of the present disclosure.

The present disclosure also provides a display device. FIG. 18 illustrates a schematic structural diagram of a display device consistent with the disclosed embodiments of the present disclosure. As shown in FIG. 18, the display device includes a display panel 118 provided by the present disclosure. The display panel 118 is configured to perform a driving method for the display panel 118, provided by the present disclosure. The display device also includes a driving device provided by the present disclosure. The driving device will not be elaborated here.

As disclosed, the technical solutions of the present disclosure have the following advantages.

In the display panel provided by the present disclosure, the first pixel row includes the first sub-pixels and the second sub-pixels alternately arranged along the first direction. The second pixel row includes a plurality of third sub-pixels arranged along the first direction. In addition, in the second direction, the first spacing between the adjacent first pixel row and the second pixel row in the first display area is greater than the second spacing between the adjacent first pixel row and the second pixel row in the second display area. Accordingly, the problem of uneven display, such as a dividing line between the first display area and the second display area (split screen phenomenon), may be alleviated, and the display effect of the first display area and the second display area of the display panel may be improved.

In the driving method provided by the present disclosure, the first pixel row in the display panel includes the first sub-pixels and the second sub-pixels alternately arranged along the first direction. The second pixel row includes a plurality of third sub-pixels arranged along the first direction. Along the second direction, the first spacing between adjacent first pixel row and second pixel row in the first display area is greater than the second spacing between adjacent first pixel row and second pixel row in the second display area. As such, the quantity of sub-pixels in the first display area per unit area may be smaller than the quantity of sub-pixels in the second display area, and the split-screen phenomenon in the first display area and the second display area may thus be alleviated. Simultaneously, the sub-pixels in the first display area and the sub-pixels in the second display area may be misaligned. Based on the spacing between the first sub-boundary and the second sub-boundary and the brightness difference between the first sub-boundary and the second sub-boundary, determination may be made on whether to adjust the picture to be displayed. The picture to be displayed may be adjusted by driving at least one row of the first pixel rows and/or at least one row of the second pixel rows adjacent to the first sub-boundary in the first sub-area. In this approach, the misalignment phenomenon between the first display area and the second display area may be alleviated, and the panel display quality may be improved.

The embodiments disclosed herein are exemplary only and not limiting the scope of the present disclosure. Various combinations, alternations, modifications, equivalents, or improvements to the technical solutions of the disclosed embodiments may be obvious to those skilled in the art. Without departing from the spirit and scope of this disclosure, such combinations, alternations, modifications, equivalents, or improvements to the disclosed embodiments are encompassed within the scope of the present disclosure.

What is claimed is:

1. A display panel, comprising a first display area and a second display area at least partially surrounding the first display area, wherein:

light transmittance of the first display area is greater than light transmittance of the second display area;

the first display area and the second display area each include a plurality of first pixel rows and a plurality of second pixel rows, wherein a first pixel row of the plurality of first pixel rows includes a first sub-pixel and a second sub-pixel that are alternately arranged along a first direction, a second pixel row of the plurality of second pixel rows includes a plurality of third sub-pixels arranged along the first direction, the first pixel row and the second pixel row are alternately arranged along a second direction, the first direction and the second direction intersect, and the first sub-pixel, the second sub-pixel and a third sub-pixel of the plurality of third sub-pixels emit light of different colors; and along the second direction, a spacing between the first pixel row and the second pixel row adjacent to the first pixel row, in the first display area, is a first spacing, and a spacing between the first pixel row and the second pixel row adjacent to the first pixel row, in the second display area, is a second spacing, wherein the second spacing is smaller than the first spacing.

2. The display panel according to claim 1, further comprising a plurality of signal lines extending along the first direction, wherein:

the first pixel row includes a first sub-pixel row and a second sub-pixel row, wherein the first sub-pixel row is disposed in the first display area, and the second sub-pixel row is disposed in the second display area; and the first sub-pixel row in the first display area and the second sub-pixel row in the second display area are electrically connected to a same scan line of the plurality of signal lines, and along the second direction, a spacing between the first sub-pixel row and the second sub-pixel row is a third spacing, wherein the third spacing is greater than zero.

3. The display panel according to claim 2, wherein:

along the second direction, the third spacing gradually increases or decreases.

4. The display panel according to claim 1, further comprising a plurality of signal lines extending along the first direction, wherein:

the second pixel row includes a third sub-pixel row and a fourth sub-pixel row, wherein the third sub-pixel row is disposed in the first display area, and the fourth sub-pixel row is disposed in the second display area; and the third sub-pixel row in the first display area and the fourth sub-pixel row in the second display area are electrically connected to a same scan line of the plurality of signal lines, and along the second direction, a spacing between the third sub-pixel row and the fourth sub-pixel row is a fourth spacing, wherein the fourth spacing is greater than zero.

5. The display panel according to claim 4, wherein: along the second direction, the fourth spacing gradually increases or decreases.

6. The display panel according to claim 1, wherein: a sub-pixel of the first sub-pixel, the second sub-pixel and the third sub-pixel includes a light-emitting element and a pixel circuit, wherein the pixel circuit and the light-emitting element are electrically connected in one-to-one correspondence.

7. The display panel according to claim 1, wherein: sub-pixels include the first sub-pixel, the second sub-pixel and the third sub-pixel; and in a unit area, a quantity of the sub-pixels in the first display area is less than a quantity of the sub-pixels in the second display area.

8. The display panel according to claim 7, wherein: in the unit area, the quantity of the sub-pixels in the first display area is greater than or equal to half of the quantity of the sub-pixels in the second display area.

9. The display panel according to claim 1, wherein: in the second display area, four third sub-pixels of the plurality of third sub-pixels in two adjacent second pixel rows of the plurality of second pixel rows form a first virtual trapezoid, wherein centers of the four third sub-pixels are respectively at vertices of the first virtual trapezoid, and one of the first sub-pixels is disposed inside the first virtual trapezoid; and in the second display area, two first sub-pixels of the first sub-pixels and two second sub-pixels of the second sub-pixels in two adjacent first pixel rows of the plurality of the first pixel rows form a second virtual trapezoid, and one of the third sub-pixels is located inside the second virtual trapezoid, wherein centers of the two first sub-pixels are respectively located at first vertices of the second virtual trapezoid, and centers of the two second sub-pixels are respectively located at second vertices of the second virtual trapezoid, and the first vertices and second vertices alternate and are spaced apart.

10. The display panel according to claim 9, wherein: in the first display area, four sub-pixels of the plurality of third sub-pixels in two adjacent second pixel rows of the plurality of second pixel rows form a first virtual parallelogram, and centers of the four third sub-pixels are respectively at vertices of the first virtual parallelogram, wherein the first sub-pixel and the second sub-pixel each intersect with two opposite virtual sides of the first virtual parallelogram, and centers of the first sub-pixel and the second sub-pixel each are disposed inside the first virtual parallelogram; and in the first display area, two first sub-pixels of the first sub-pixels and two the second sub-pixels of the second sub-pixels in two adjacent first pixel rows of the plurality of second pixel rows form a second virtual parallelogram, centers of the two second sub-pixels are at two first vertices of the second virtual parallelogram, and centers of the two first sub-pixel are at two second vertices of the second virtual parallelogram, wherein the two first vertices are adjacent, the two second vertices are adjacent, two third sub-pixels of the third sub-pixels each intersect with two opposite virtual sides of the second virtual parallelogram, and centers of the two third sub-pixels are outside the second virtual parallelogram.

11. The display panel according to claim 9, wherein: in the first display area, one first sub-pixel of the first sub-pixels, one second sub-pixel of the second sub-pixels and two third sub-pixels of the third sub-pixels in one first pixel row of the first pixel rows and one second pixel row of the second pixel rows form a third virtual trapezoid, wherein the one first pixel row and the one second pixel row are adjacent, centers of the one first sub-pixel, the one second sub-pixel and the two third sub-pixels are respectively located at vertices of the third virtual trapezoid.

12. The display panel according to claim 9, wherein: in the first display area, four third sub-pixels of the third sub-pixels in two adjacent second pixel rows of the plurality of second pixel rows form a third virtual parallelogram, wherein centers of the four third sub-pixels are respectively at vertices of the third virtual parallelogram, and one first sub-pixel of the first sub-pixels is located inside the third virtual parallelogram; and in the first display area, two first sub-pixels of the first sub-pixels and two second sub-pixels of the second sub-pixels in two adjacent first pixel rows of the plurality of first pixel rows form a fourth virtual parallelogram, wherein centers of the two second sub-pixels are at two first vertices of the fourth virtual parallelogram, centers of the two first sub-pixel are at two second vertices of the fourth virtual parallelogram, the two first vertices are adjacent, the two second vertices are adjacent, and one third sub-pixel of the third sub-pixels is inside the fourth virtual parallelogram.

13. The display panel according to claim 12, wherein: one first sub-pixel of the first sub-pixels, one second sub-pixel of the second sub-pixels and two third sub-pixels of the third sub-pixels in one first pixel row of first pixel rows and one second pixel row of the second pixel rows form a virtual quadrilateral, wherein the one first pixel row and the one second pixel row are adjacent, and centers of the one first sub-pixel, the one second sub-pixel and the two third sub-pixels are respectively located at vertices of the virtual quadrilateral.

14. A driving method for a display panel, wherein: the display panel includes a first display area and a second display area at least partially surrounding the first display area, wherein:

light transmittance of the first display area is greater than light transmittance of the second display area;

the first display area and the second display area each include a plurality of first pixel rows and a plurality of second pixel rows, wherein a first pixel row of the plurality of first pixel rows includes a first sub-pixel and a second sub-pixel that are alternately arranged along a first direction, a second pixel row of the plurality of second pixel rows includes a plurality of third sub-pixels arranged along the first direction, the first pixel row and the second pixel row are alternately arranged along a second direction, the first direction and the second direction intersect, and the first sub-pixel, the second sub-pixel and a third sub-pixel of the plurality of third sub-pixels emit light of different colors;

along the second direction, a spacing between the first pixel row and the second pixel row adjacent to the first pixel row, in the first display area, is a first spacing, and a spacing between the first pixel row and the second pixel row adjacent to the first pixel row, in the second display area, is a second spacing, wherein the second spacing is smaller than the first spacing; and the display panel further includes a junction area, wherein the junction area includes a first sub-area and a second sub-area that are adjacent along the first direction, the first sub-area is located in the first display area, and the second sub-area is located in the second display area; and the driving method includes:

determining whether a picture to be displayed is a specific picture, wherein the specific picture is at least partially located in the junction area and includes a boundary to be displayed in the junction area, and the boundary to be displayed includes a first sub-boundary located in the first sub-area and a second sub-boundary located in the second sub-area; and determining whether to adjust the picture to be displayed based on a spacing between the first sub-boundary and the second sub-boundary in the second direction and brightness difference between the first sub-boundary and the second sub-boundary, and if so, driving at least one first pixel row of the first pixel rows and/or at least one second pixel row of the second pixel rows adjacent to the first sub-boundary in the first sub-area for display.

15. The driving method according to claim 14, further comprising:

based on the spacing between the first sub-boundary and the second sub-boundary in the second direction and the brightness difference between the first sub-boundary and the second sub-boundary, determining whether to adjust the picture to be displayed, and if so, driving at least one first pixel row of the first pixel rows and/or at least one second pixel row of the second pixel rows adjacent to the second sub-boundary in the second sub-area for display.

16. The driving method according to claim 14, wherein, determining whether to adjust the picture to be displayed based on the spacing between the first sub-boundary and the second sub-boundary in the second direction and the brightness difference between the first sub-boundary and the second sub-boundary, includes:

determining whether the spacing between the first sub-boundary and the second sub-boundary in the second direction is greater than a preset spacing, and if so, the picture to be displayed needs to be adjusted.

17. The driving method according to claim 14, wherein, determining whether to adjust the picture to be displayed based on the spacing between the first sub-boundary and the second sub-boundary in the second direction and the brightness difference between the first sub-boundary and the second sub-boundary, includes:

obtaining a brightness difference value of the boundary to be displayed, wherein the brightness difference value is one of the following: difference between brightness of a first position point of the first sub-boundary and brightness of a second position point of the second sub-area, difference between average brightness of the first sub-boundary and average brightness of a target line segment of the second sub-area, and difference between the brightness of the first pixel point of the first sub-boundary and brightness of a third position point of the second sub-area, wherein the second position point is on a straight line where the first sub-boundary is located, the target line segment is on a straight line where the first sub-boundary is located and has a same length as the first sub-boundary, positions of the first pixel point and the third position point are symmetrical with respect to a junction in a target sub-junction area, and the junction in the target sub-junction area is between and equidistant from the first sub-area and the second sub-area; and determining whether the brightness difference value between the first sub-boundary and the second sub-boundary is greater than a preset threshold, and if so, adjusting the picture to be displayed.

18. A display device, comprising a display panel, wherein the display panel includes a first display area and a second display area at least partially surrounding the first display area, wherein:

light transmittance of the first display area is greater than light transmittance of the second display area;

the first display area and the second display area each include a plurality of first pixel rows and a plurality of second pixel rows, wherein a first pixel row of the plurality of first pixel rows includes a first sub-pixel and a second sub-pixel that are alternately arranged along a first direction, a second pixel row of the plurality of second pixel rows includes a plurality of third sub-pixels arranged along the first direction, the first pixel row and the second pixel row are alternately arranged along a second direction, the first direction and the second direction intersect, and the first sub-pixel, the second sub-pixel and a third sub-pixel of the plurality of third sub-pixels emit light of different colors; and along the second direction, a spacing between the first pixel row and the second pixel row adjacent to the first pixel row, in the first display area, is a first spacing, and a spacing between the first pixel row and the second pixel row adjacent to the first pixel row, in the second display area, is a second spacing, wherein the second spacing is smaller than the first spacing.

19. The display device according to claim 18, further comprising a driving device, wherein:

the display panel further includes a junction area, wherein the junction area includes a first sub-area and a second sub-area that are adjacent along the first direction, the first sub-area is located in the first display area, and the second sub-area is located in the second display area; and the driving device includes:

a determination unit, configured to determine whether a picture to be displayed is a specific picture, wherein the specific picture is at least partially located in the junction area and includes a boundary to be displayed in the junction area, and the boundary to be displayed includes a first sub-boundary located in the first sub-area and a second sub-boundary located in the second sub-area; and a first judgment unit, configured to determine whether to adjust the picture to be displayed based on a spacing between the first sub-boundary and the second sub-boundary in the second direction and brightness difference between the first sub-boundary and the second sub-boundary, and if so, drive at least one first pixel row of the first pixel rows and/or at least one second pixel row of the second pixel rows adjacent to the first sub-boundary in the first sub-area for display.

20. The display device according to claim 19, wherein the driving device further includes a second judgment unit, wherein:

the second judgment unit is configured to determine whether to adjust the picture to be displayed based on the spacing between the first sub-boundary and the second sub-boundary in the second direction and the brightness difference between the first sub-boundary and the second sub-boundary, and if so, drive at least one first pixel row of the first pixel rows and/or at least one second pixel row of the second pixel rows adjacent to the second sub-boundary in the second sub-area for display.

* * * * *